United States Patent [19]
Watanabe et al.

[11] Patent Number: 5,424,960
[45] Date of Patent: Jun. 13, 1995

[54] APPARATUS FOR MEASURING TORQUE, INERTIA MOMENT, OUTPUT AND BACKLASH USING STEPPING MOTOR

[75] Inventors: Asao Watanabe, Kawasaki; Shuji Satoh, Tokyo, both of Japan

[73] Assignees: NF. T&M. Systems. Inc., Kawasaki; Nippon Pulse Motor Co., Ltd., Tokyo, both of Japan

[21] Appl. No.: 949,713

[22] Filed: Sep. 23, 1992

[30] Foreign Application Priority Data

| Sep. 24, 1991 | [JP] | Japan | 3-272018 |
| Oct. 9, 1991 | [JP] | Japan | 3-290856 |
| May 27, 1992 | [JP] | Japan | 4-160256 |
| May 27, 1992 | [JP] | Japan | 4-160257 |
| May 27, 1992 | [JP] | Japan | 4-160258 |
| May 27, 1992 | [JP] | Japan | 4-160259 |

[51] Int. Cl.$^6$ ............................. G05B 19/40
[52] U.S. Cl. ..................... 364/506; 324/158.1; 318/696
[58] Field of Search ............ 364/506, 571.01, 571.04, 364/571.07; 324/158 MG; 73/862.08, 862.191; 318/696; 395/20, 21, 23

[56] References Cited

U.S. PATENT DOCUMENTS

| 4,330,739 | 5/1982 | Chiang | 324/158 MG |
| 4,422,040 | 12/1983 | Raider et al. | 324/158 MG |
| 4,611,157 | 9/1986 | Miller et al. | 318/696 |
| 4,623,828 | 11/1986 | Schmitz | 318/696 |
| 4,672,282 | 6/1987 | Boillat | 318/696 |
| 5,255,347 | 10/1993 | Matsuba et al. | 395/23 |

Primary Examiner—Emanuel T. Voeltz
Assistant Examiner—Edward Pipala
Attorney, Agent, or Firm—Dellett and Walters

[57] ABSTRACT

Characteristic parameters of a torque of a stepping motor and its associated driving current or voltage are measured in advance to provide torque vs. characteristic information data representative of the torque vs. driving current/voltage characterisitcs. Then, the above characteristic parameters are measured again when a real load is applied to a stepping motor as installed with associated mechanical coupling components. An actual load torque is determined by referencing the subsequently measured characteristic parameters to the previously obtained torque vs. characteristic information data. A load inertia moment can be determined by subtracting the motor's rotor inertia moment from a determined inertia moment of the entire system. Efficiency of the motor can be determined by multiplying the output of the measured load torque by the number of revolutions per second thereof and dividing this by the power supplied to the motor or driving circuit. Backlash can be determined from the play in the changes of associated current waveforms corresponding to particular intervals, i.e., an interval from when the direction of rotation of the motor is changed to when the load torque increases again.

17 Claims, 32 Drawing Sheets

FIG. II

F I G. 12
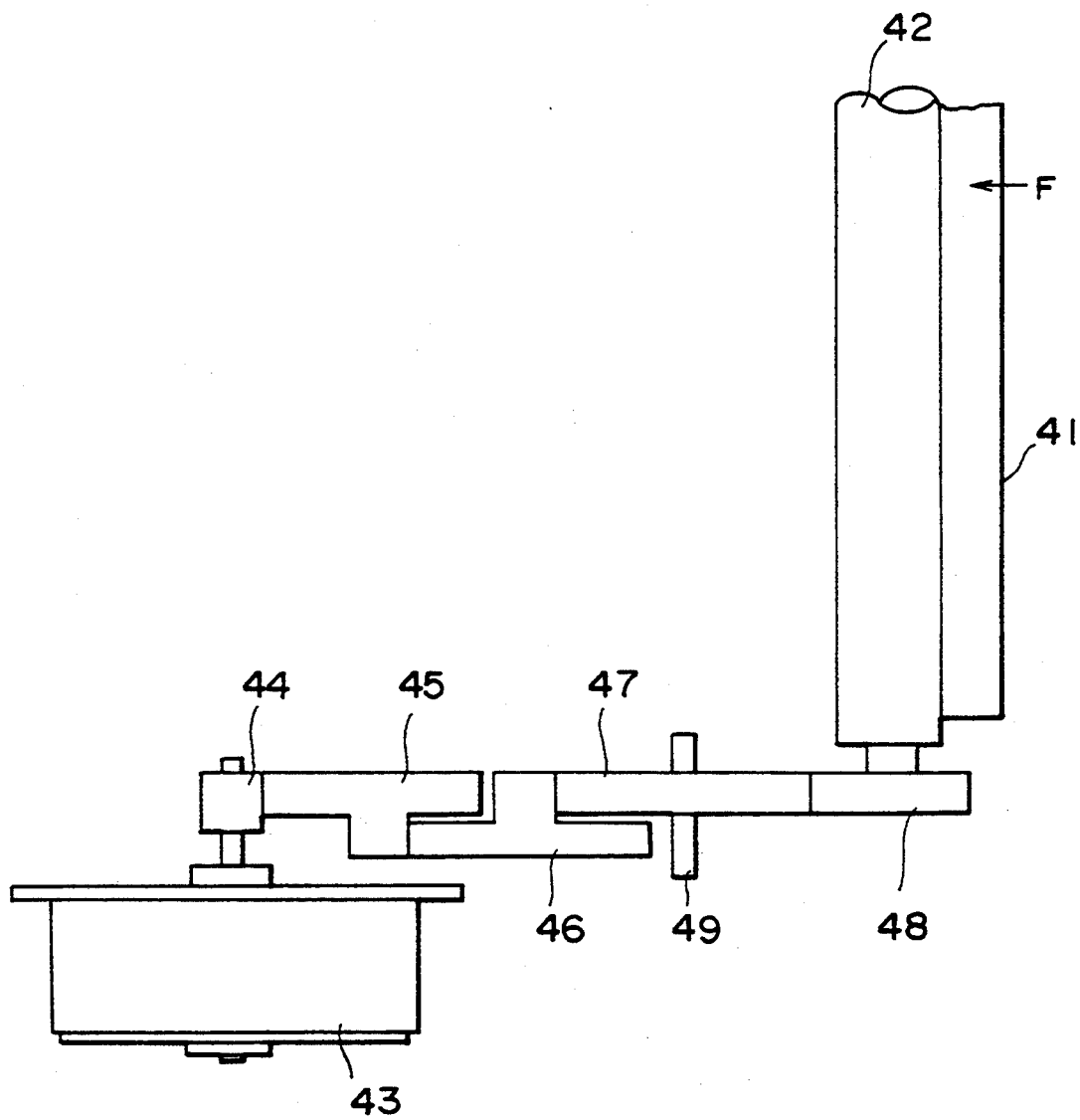

APPARATUS FOR MEASURING TORQUE, INERTIA MOMENT, OUTPUT AND BACKLASH USING STEPPING MOTOR

BACKGROUND OF THE INVENTION

The present invention relates generally to a measurement apparatus for a stepping motor, and more specifically to an apparatus for measuring load torque, load inertia moment, output or efficiency, and backlash using a stepping motor.

Stepping motors find very wide applications in various fields as mechanical driving sources because their rotary angle and rotary speed can be controlled very accurately using digital pulses under control of a micro computer. For example, stepping motors are being used extensively in booming OA (office automation) equipment such as floppy disk drives (FDDs), hard disk drives (HDDs), printers, electronic typewriters, plain paper copy (PPC) machines, recorders, plotters, etc. and FA (factory automation) machines and equipment such as industrial robots, etc.

Load torque, load inertia moment, output or efficiency and backlash are major characteristics of stepping motors which affect development, design, production and quality control of stepping motors. Unfortunately, it is very difficult to measure such characteristics or performance with a high degree of accuracy.

For example, in measuring the load torque of a stepping motor using a spur reduction gear coupled to the mechanical component, the torque tends to vary over a wide range. That is, the load torque may be, for example, 100 g·cm if the intermeshing between the pinion gear mounted on the motor output shaft and the first stage gear is relatively loose but 300 g·cm if the above intermeshing is hard (or pushed hard). Also, the intermeshing of the subsequent gear stages affects the measurements with less influence as the stage becomes farther from the first stage. Additional influential factors include the degree of eccentricity and precision between shafts of the mechanical components, and accuracy of assembling the mechanical components such as parallelism, tension of timing belts and wires, etc.

A conventional method of measuring the torque of a stepping motor (the motor torque required by the load) is to mount a dummy motor to the system to be measured (mechanical component). The dummy motor is equal in size and shape to the actual motor but excluding coils, magnets, etc. A torque gauge is coupled to the motor output shaft in the motor pinion by way of a collet chuck or the like. The torque is measured by manually rotating the motor. Another method of measuring the torque is to use a specially designed motor having the shaft extending from both sides of the motor. The motor has the same specification as the actual stepping motor. A torque gauge is coupled to the torque measurement shaft of the motor using a collet chuck while coupling the mechanical components to the other side of the motor shaft.

Another method of obtaining the load torque T (g·cm) comprises mounting a pulley of radius r (cm) on the motor output shaft and winding a string around the pulley to measure the force F (g) using a spring scale. The torque T is determined by the following expression:

$$T = F \times r \text{ (g·cm)}$$

Still other methods of measuring torque include the use of a torque meter utilizing the current/torque characteristic of a DC motor and the use of a torque gauge between the motor and the load.

As mentioned above, there are many methods of measuring the torque of a motor. However, none of them is satisfactory especially in regard to measurement accuracy.

For example, in the method of using a dummy motor or a pulley and a spring scale it is difficult to provide a desired number of revolutions to the load. In the former method, it is difficult to avoid the increase in load torque due to side loading by a slanted torque gauge. In the latter method, it is also difficult to stably mount the pulley and thus to avoid the effect of side load.

In the method of using a stepping motor having the same specification as the actual stepping motor, there is a magnet in the rotor of the motor. This means that the detention torque of the magnet is unavoidably included in the measurements. When the rotor is rotated, the magnet will generate electricity in the stator coil, thereby causing dynamic braking. Also, inclination of the torque gauge will present a side load to the motor bearing in such a manner as to increase the load torque. These are causes for reduced measurement accuracy.

In the method of using the current/torque characteristic of a DC motor, it is required to disassemble the motor whenever the measurement is to be made. The load torque tends to change due to intermeshing of the pinion and gear when reassembling the motor. It is therefore difficult to know exactly how large a torque is generated by the motor in actual operation.

The above discussions lead to the conclusion that in the conventional methods for measuring torque it is impossible to measure the torque of a motor coupled to the load with a high degree of accuracy. In other words, what is needed is to know the load torque of an individual motor in quantity production with fluctuations of intermeshing of the pinion gear and the first stage gear and tension of the motor timing pulley and the timing belt. However, what is actually done is to guess the load torque by substitution means different from the actual structure. Accordingly, it has been impossible to know the torque margin or the torque generated by the motor and the load torque. The practice in production is to guarantee product reliability by performing time consuming and expensive voltage fluctuation tests, temperature tests, aging tests, printing tests, etc. before product shipment. However, when the mechanical components do not operate properly, it was necessary to spend a long time investigating the cause of trouble which may have been attributable to insufficient torque margin by designer's mistake, improper adjustment in the production line, insufficient torque due to trouble in the motor, troubles in the mechanical components, etc.

There are similar problems in measuring load inertia moment, output or efficiency and backlash of a stepping motor as a result of the above difficulties associated with the torque measurement.

SUMMARY OF THE INVENTION

It is therefore an object of the present invention to provide an apparatus for measuring, at a high degree of accuracy, load torque, load inertia moment, output or efficiency and backlash using a stepping motor while the motor is installed in conjunction with mechanical components.

In the present invention, characteristic parameters of torque and the stepping motor driving current or voltage are measured in advance to obtain torque vs. characteristic information data representing the torque vs. driving current/voltage characteristic information. Then, the above characteristic parameters are measured when a real load is applied to a stepping motor installed with the associated mechanical components. An actual load torque is measured by referring the measured characteristic parameters to the above torque vs. characteristic information data.

A frequency vs. pull-out torque characteristic of a stepping motor is measured in advance. The stepping motor under test is driven in an actual measurement from low to high frequencies. The actual load torque can be measured based on the frequencies where pull-out occurs and the above frequency vs. pull-out torque characteristic.

Also, in the present invention, when measuring the torque by comparing the characteristic in waveform of the driving current in any desired phase to drive a stepping motor with that of the driving current under a known torque conditions, the driving voltage of the motor is optimized so that the motor does not pull-out.

The torque is measured by comparing the characteristic in the driving current waveform in any desired phase when driving the stepping motor with that of the driving current under a known torque condition. An inertia moment can be measured from the difference between the load torque when rotating the motor at a constant frequency and the load torque when rotating the motor at a constant acceleration. Also, the load inertia moment can be known by subtracting the rotor inertia moment of the motor from the inertia moment of the entire system.

Additionally, an efficiency of the motor can be obtained from the output of the measured load torque multiplied by the number of revolutions and divided by the power supplied to the motor or the driving circuit.

Further, the backlash can be measured from the play of the change in the above current waveform when the direction of rotation of the motor is changed until the load torque increases again.

Let the amount of characteristic in the above driving current be the integration of current at a particular portion of the driving current waveform in any phase at the time when the pulse is applied. The integration span may be, for example, from the time current starts to flow in a certain phase of the stepping motor to the time current starts to flow in the other phase. It is of course possible that the characteristic amount of the above driving current waveform may be the integration of the driving current in its positive polarity provided that it does not exceed a predetermined constant time.

BRIEF DESCRIPTION OF DRAWINGS

FIG. 12 shows a mounting structure of the stepping motor to a facsimile transmitter as a practical application of the present invention.

PREFERRED EMBODIMENTS OF THE INVENTION

Now, embodiments of the present invention will be described by reference to the accompanying drawings.

The present invention is directed to measure actual load based on features such as waveform, peak value and the like particular to the load torque with a current (driving current) in the coil of a stepping motor. That is, as described, features in the coil current are measured and stored in advance by applying reference load torques from a reference load torque generator to the stepping motor to be measured. A driving current waveform is measured under any desired load condition by coupling an actual mechanical component. Then, the measured features in the coil current are compared with the stored features to determine the actual load.

Incidentally, there are two types of windings for a stepping motor; one is a monofilar (single) winding to be driven by a bipolar driving circuit and the other is a bifilar (dual) winding to be driven by a unipolar driving circuit. Also, there are three types of exciting circuits to cause a current to flow in the coil. They are a constant voltage system to excite the coil by a constant voltage, a double voltage system to excite the coil using two different voltages, and a constant current chopping system to drive the coil so as to provide a constant exciting current. The inventors found changes (features) in the current waveform depending on the load in each of the driving systems through experiments. However, the changes in the current waveform are more significant in the unipolar or bipolar driving circuits working with constant voltage excitation.

Frequencies for measurement of the current waveform vary from low frequency such as 10 (PPS) to loaded maximum self-excited operating frequency, and in some cases to the loaded maximum continuous response frequency. Especially, the preferable frequency range is found to provide a stable current waveform avoiding a frequency range causing resonance or racing.

Although the torque characteristic of motors in quantity production may vary, the variation remains less than ±10% in PM type stepping motors and less than ±5% in HB type stepping motors. Accordingly, the measurement apparatus according to the present invention is sufficient for practical purposes. According to an experiment, in the case of a spur gear reduction section in a facsimile receiving mechanism in quantity production, the load was 100-130 (g·cm), when intermeshing between the pinion gear of the motor output shaft and the first stage gear was optimum and 250-300 (g·cm) when the motor pinion gear was assembled closer to the first stage gear. This means that variation due to assembly and adjustment of the mechanical components is as large as ±100% as compared to ±5-±10% variation in the torque characteristic among motors.

Figure 1A:
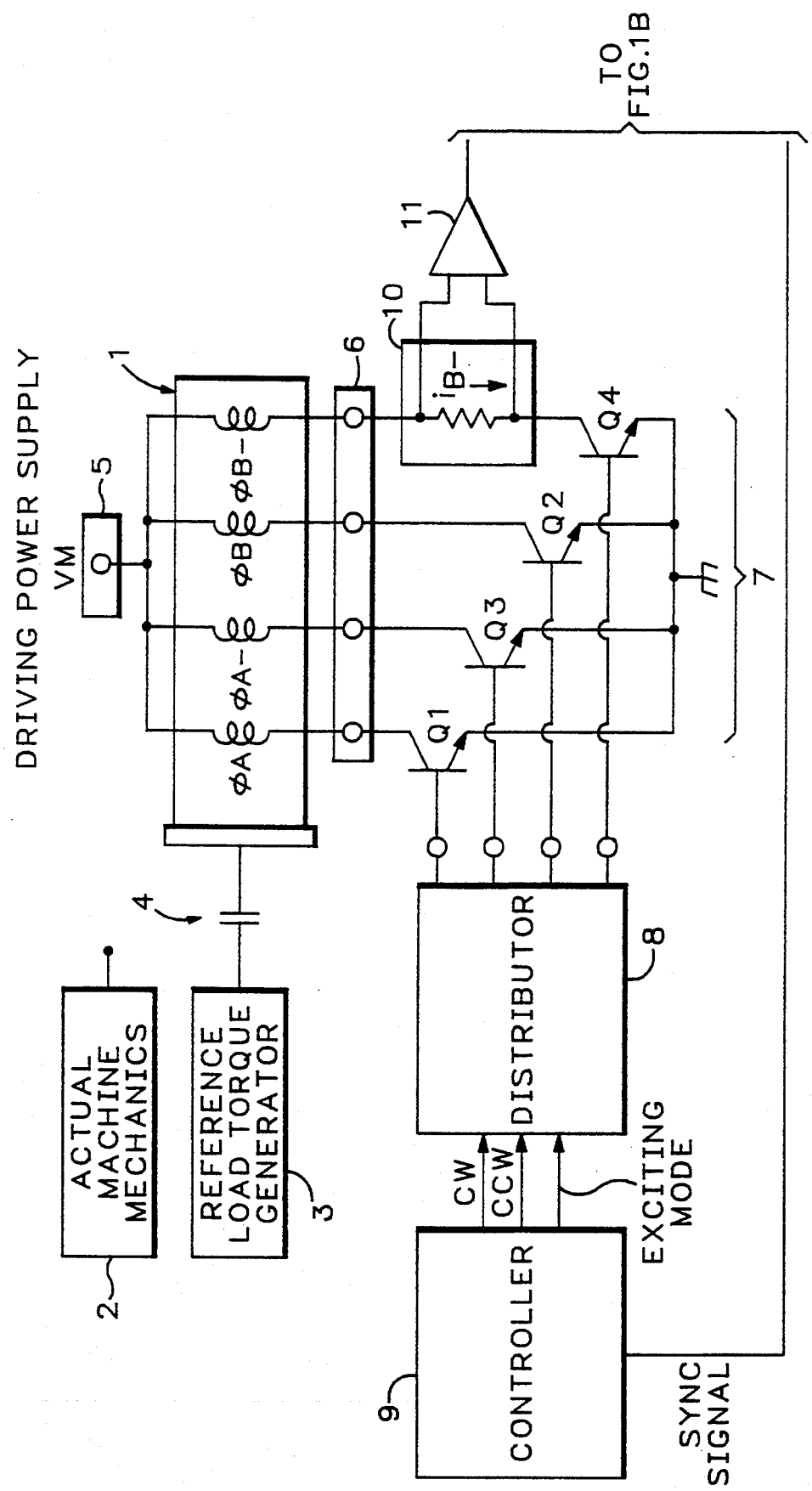
FIGS. 1A-B are a block diagram of one embodiment of the load torque measurement apparatus for a stepping motor according to the present invention.
Figure 1B:
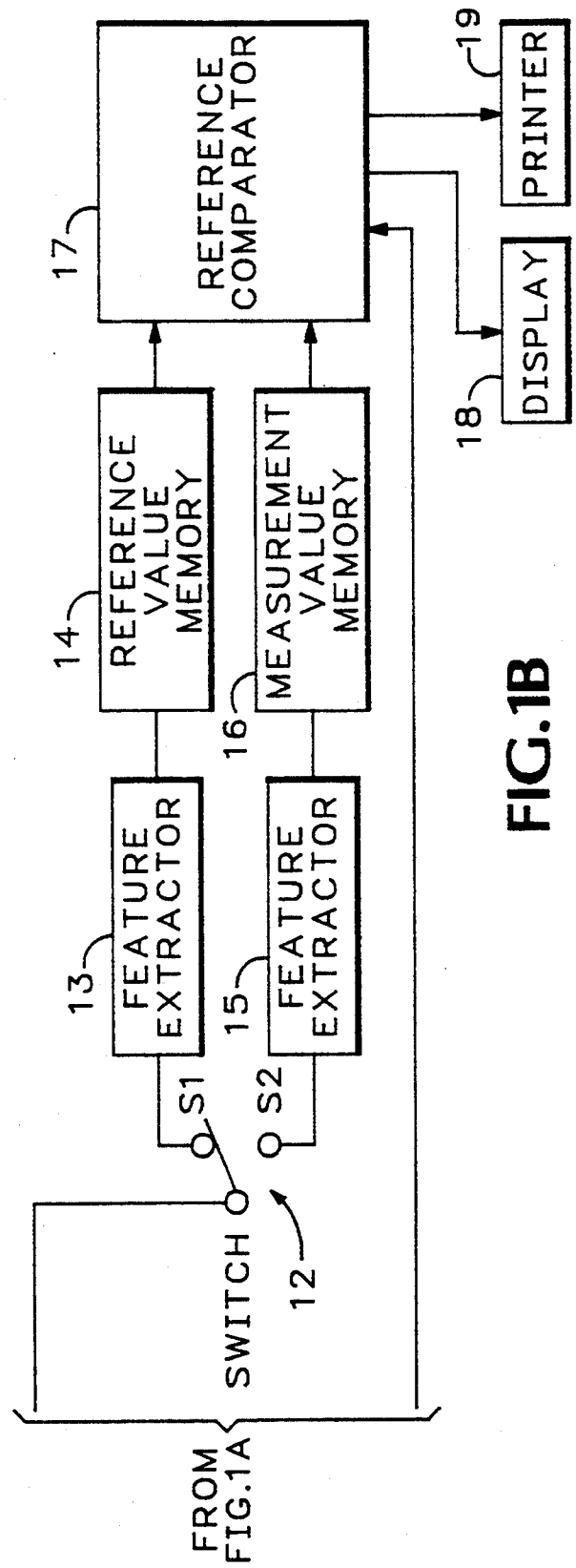

Now, illustrated in FIGS. 1A-B is the entire view in construction of one embodiment of the load torque measurement apparatus for a stepping motor according to the present invention.

One end of each winding (bifilar coil) $\Phi A$, $\Phi A-$, $\Phi B$, $\Phi B-$ of a stepping motor 1 is connected to an external power supply VM by way of a connector 5 while the other end is connected to a switching transistor Q1, Q3, Q2, Q4 for a respective winding by way of a connector 6. By operating the switching transistors Q1 through Q4 with appropriate timing, pulse application to each winding is controlled to switch exciting.

The switching transistors Q1 through Q4 constitute a driving circuit 7 to drive the stepping motor.

A controller 9 includes an oscillation circuit to generate a clock (CLOCK in FIG. 2) acting as a timing reference to apply a pulse to the windings and a positioning circuit to determine the rotary angle (position) of the stepping motor. A clockwise revolution clock CW, a counter-clockwise revolution clock CCW and an exciting mode signal are generated.

Figure 2:
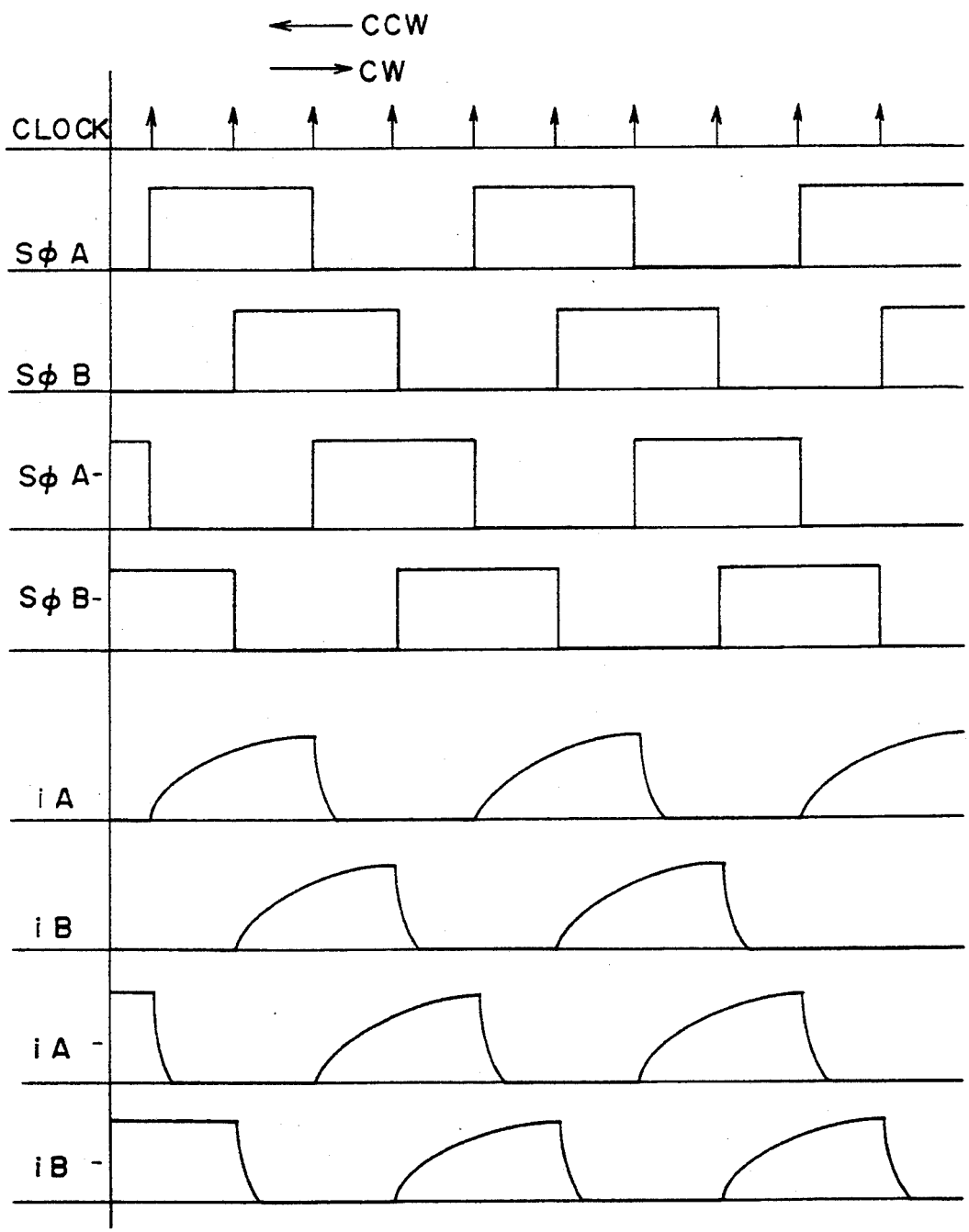
FIG. 2 illustrates pulse and driving current waveforms to be applied to windings in the stepping motor in the embodiment of FIGS. 1A-B.

A distribution circuit 8 receives the clock pulse CLOCK and the exciting mode signal and controls the switching transistors Q1 through Q4 to supply 2—2 phase exciting pulses $S\Phi A$, $S\Phi B$, $S\Phi A-$, $S\Phi B-$ to each winding as shown in FIG. 2. Such pulses cause general currents iA, iB, iA—, iB— in each winding $\Phi A$, $\Phi B$, $\Phi A-$, $\Phi B-$ as shown in FIG. 2.

Now, firstly, coupled to the output shaft of the stepping motor 1 by way of a coupling 4 is a reference load torque generator 3 to change the torque. The stepping motor 1 is a master motor whose motor specification is known. Specified at this time are motor driving voltage, motor driving frequency, exciting mode, coil exciting switching transistors and the associated coil counter electromotive force absorbing circuit (not shown). The coil current tends to vary as the torque varies. Measurements of the coil current are made by providing a current detector 10 inserted in any winding (the winding $\Phi B-$ in this particular example) to detect the coil current iB—. The coil current iB— is amplified by an amplifier 11 before being supplied to feature extraction portion 13 by way of a terminal S1 of a switch 12.

Figure 3:
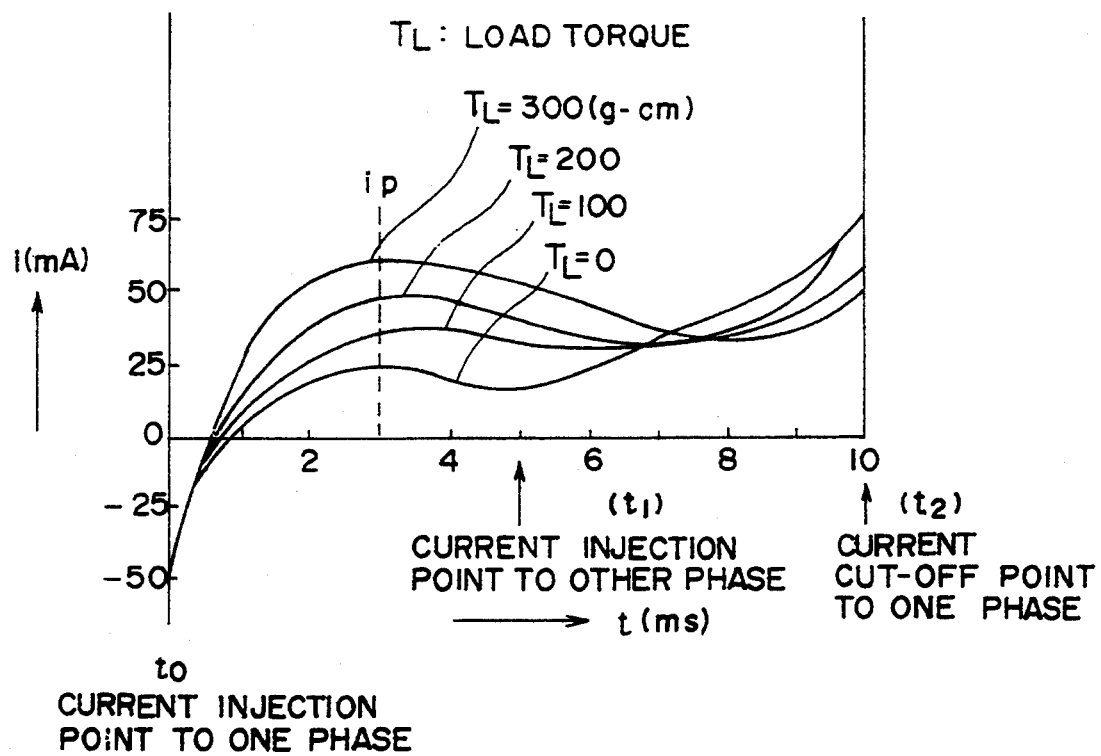
FIG. 3 is a graph to show the change in time of driving current in a winding with the load to the stepping motor as a parameter.

The feature extraction portion 13 extracts features in the torque vs. current waveform including various information (parameters). For example, illustrated in FIG. 3 is change in the driving current of the stepping motor when the torque TL is changed to 0, 100, 200 and 300 (g·cm) as a parameter. It is apparent from the change (current waveform) that the driving current in the stepping motor is not appropriately expressed as an equivalent circuit or a series circuit of inductance and resistance as commonly understood. Alternately, the equivalent circuit must include not only inductance and resistance but also counter electromotive force equivalently causing conversion of the input power to the secondary side (rotor).

Now, when suitable voltage is applied to the phase in question (current injection point to one phase), the current in that phase tends to increase rapidly at first and then slows down in the rate of increase to reach the peak value iP before decreasing. Since the motor is excited in two phases, half way of applying the voltage to one phase, a voltage is applied to the other phase (current injection point to the other phase). At this time, the current waveform in the one phase exhibits a slight dip (not shown clearly in the drawing). Subsequently, the coil current continues to decrease for a certain time depending on the magnitude of the load torque before reaching the minimum value. Then, the current increases sharply and the current to the one phase is cut off by a driving current at the time when the current reached the peak value (current cut off point for one phase).

As is apparent from FIG. 3, the average value of the driving current remains essentially constant even if the load torque is varied. However, current change at the beginning of current flow in one phase to the current injection point to the other phase is significant.

Figure 4:
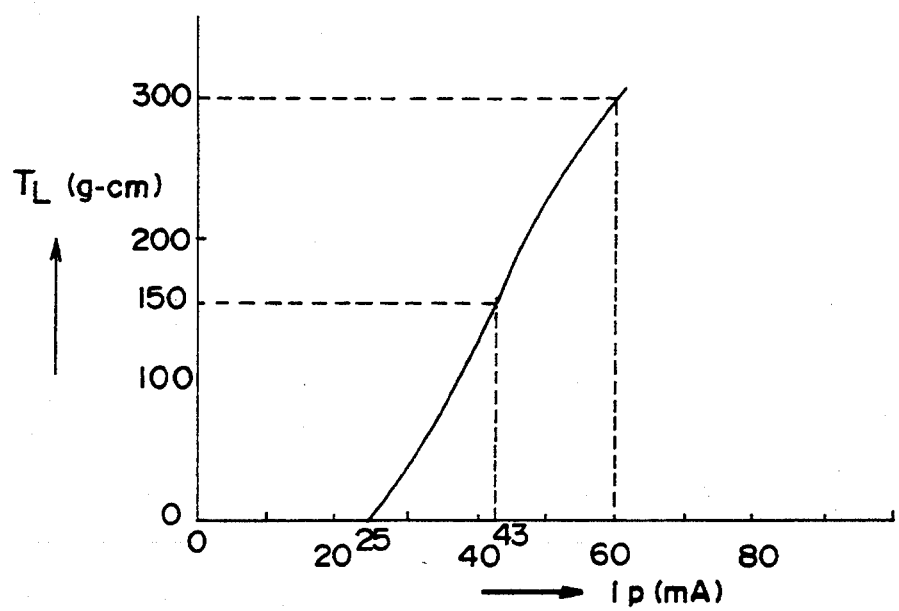
FIG. 4 is a graph to show the relationship between the peak value ip of the driving current in the winding and the load torque.

For example, noting the load torque and the peak current value iP in FIG. 3, data interpolation will lead to the relationship in FIG. 4. When the load torque TL=0 (g·cm), iP=25 (mA). When TL=300 (g·cm), iP=60 (mA). Apparently, the current tends to increase smoothly in proportion to the increase in the load torque. The peak value is reached at substantially constant timing regardless of the load torque. This suggests that the current value at for example 30% elapse of the period from the current rising point can be used as the feature information.

The feature extraction circuit 13 in FIGS. 1A–B extracts the relationship between the peak value and the load torque in the driving current from the amplifier 11 within the start-up changing region as the torque vs. current data. It is of course true that the feature to be extracted by the feature extraction portion 13 is not limited to the peak value and may alternatively be any characteristic information with respect to the load torque.

The load torque generated by the reference load generator 3 is selected at 5 points, i.e., 0%, 20%, 40%, 60% and 80% points with 0% and 100% being no-load torque and the torque where pull-out occurs, respectively.

The extracted feature information (peak value in the torque vs. current characteristic in this particular example) is stored as a reference value in a reference value memory 14 such as a ROM, a floppy disk or the like.

On the other hand, in case of measuring the real load, characterized by coupling the actual mechanical component 2 to the stepping motor 1 using the coupling 4, the switch 12 is switched to the terminal S2 and the same condition as the motor driving condition of the master motor is set. The driving current to be detected by the current detector 10 is amplified by the amplifier 11 before being transmitted to the feature extraction portion 15 by way of the terminal S2 of the switch 12. The feature extraction portion 15 receives the coil current from the amplifier 11 and detects the peak value iP of the current to be temporarily stored in a measurement value memory 16 as the feature information.

A reference judgment portion 17 outputs the actual load torque by comparing the peak value iP information stored in the measurement value memory 14 to the torque vs. current relation data stored in the reference value memory 14 as shown in FIG. 4 in response to the sync signal from the controller 9. For example, if the peak value iP derived from the feature extraction portion 15 is 43 mA, the actual load is determined to be 150 (g·cm) from the graph in FIG. 4.

The load torque data obtained in the above manner is displayed on a display 18 and also printed out by a printer 19.

It is to be appreciated that the feature extraction portions 13 and 15 may be commonly used. Also, the motors for reference (calibration) and actual measurement are different motors of the same type.

Although the feature extraction is performed in the current waveform in the above example, a voltage waveform can be substituted for the current waveform in a case of systems having relatively high power supply impedance because current change accompanies power supply voltage change.

Figure 5:
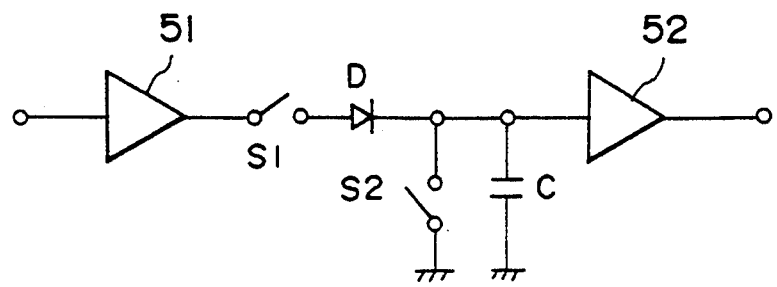
FIG. 5 is a circuit schematic of characteristic extraction portions 13, 14 in the embodiment in FIGS. 1A-B.

FIG. 5 is a block diagram of one embodiment of the feature extraction circuits 13, 15 in FIGS. 1A–B.

Figure 6:
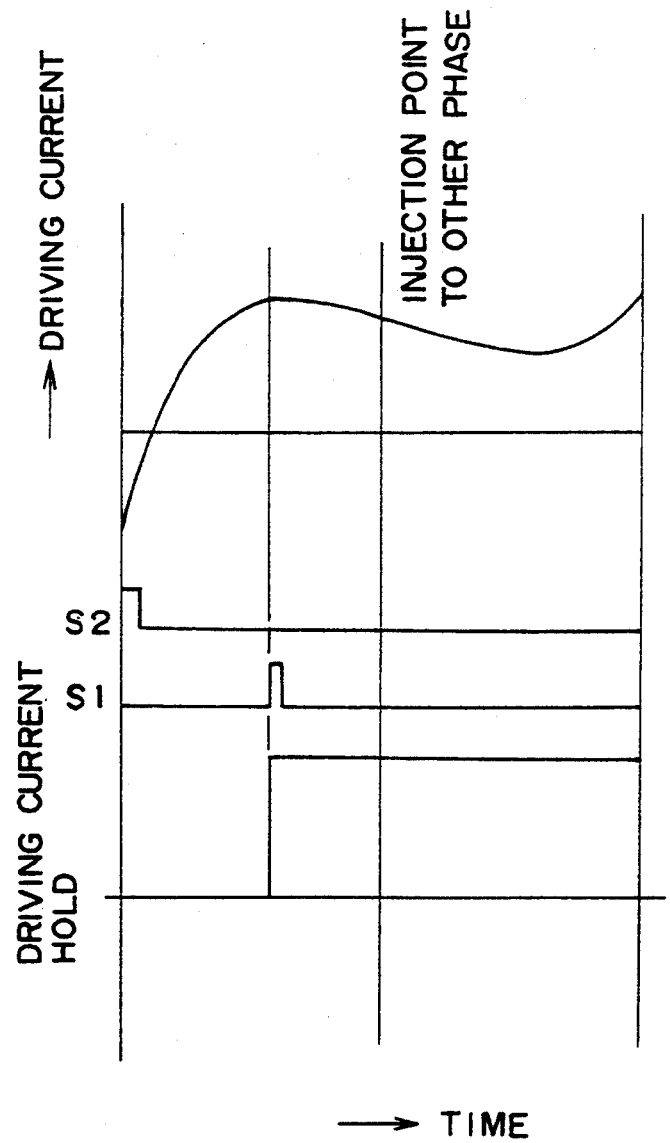
FIG. 6 illustrates waveforms to explain the operation of the circuit in FIG. 5.

In this embodiment, the switch S1 is closed for a moment at a constant time (about 3 ms in this particular example) after the "current injection point to one phase" to cause the current flow through the buffer amplifier 51, the amplifier 11, and diode D for charging the capacitor C which holds the value close to the peak value iP. The capacitor C is periodically discharged at the current injection point to the one phase by the switch S2 to prepare for the next measurement. The potential of the capacitor C is buffered by the buffer amplifier 52 to output the driving current holding value (peak value information). FIG. 6 shows the time chart of the signal waveforms.

Figure 7:
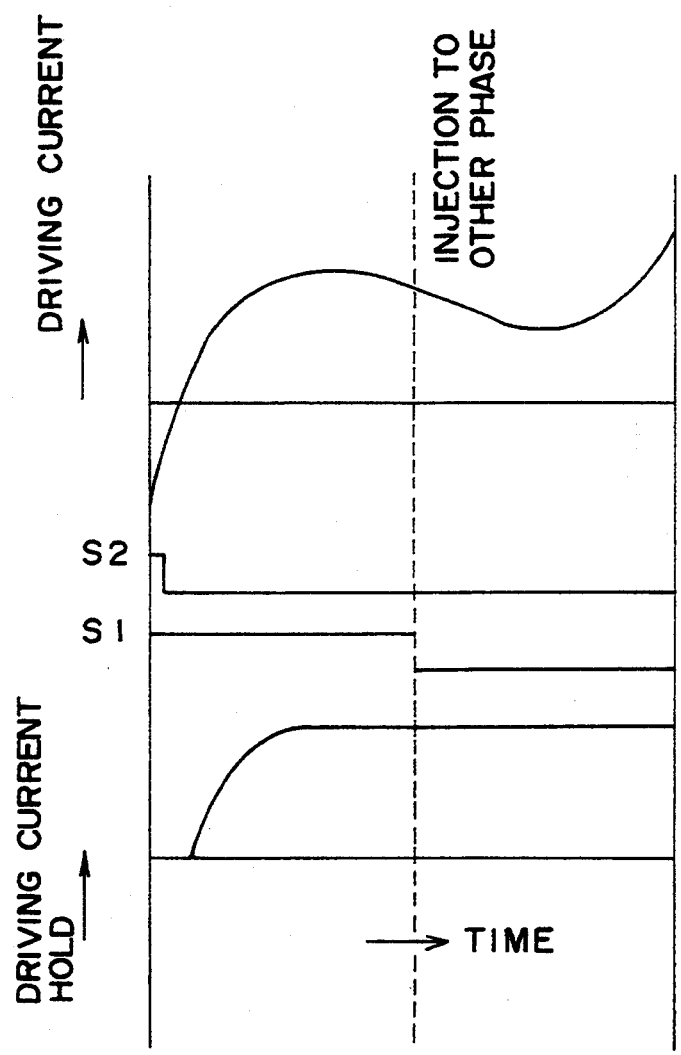
FIG. 7 illustrates waveforms to explain other aspects of operation of the circuit in FIG. 5.

In FIG. 5, the switch S2 is closed for a moment at the current injection point to the one phase to discharge the capacitor C. By closing the switch S1 from the current injection to the one phase to the current injection to the other phase, the capacitor C will be charged to the peak level in the driving current by the diode D during this time interval and the peak level iP will be held. This relation is illustrated in FIG. 7.

Figure 8:
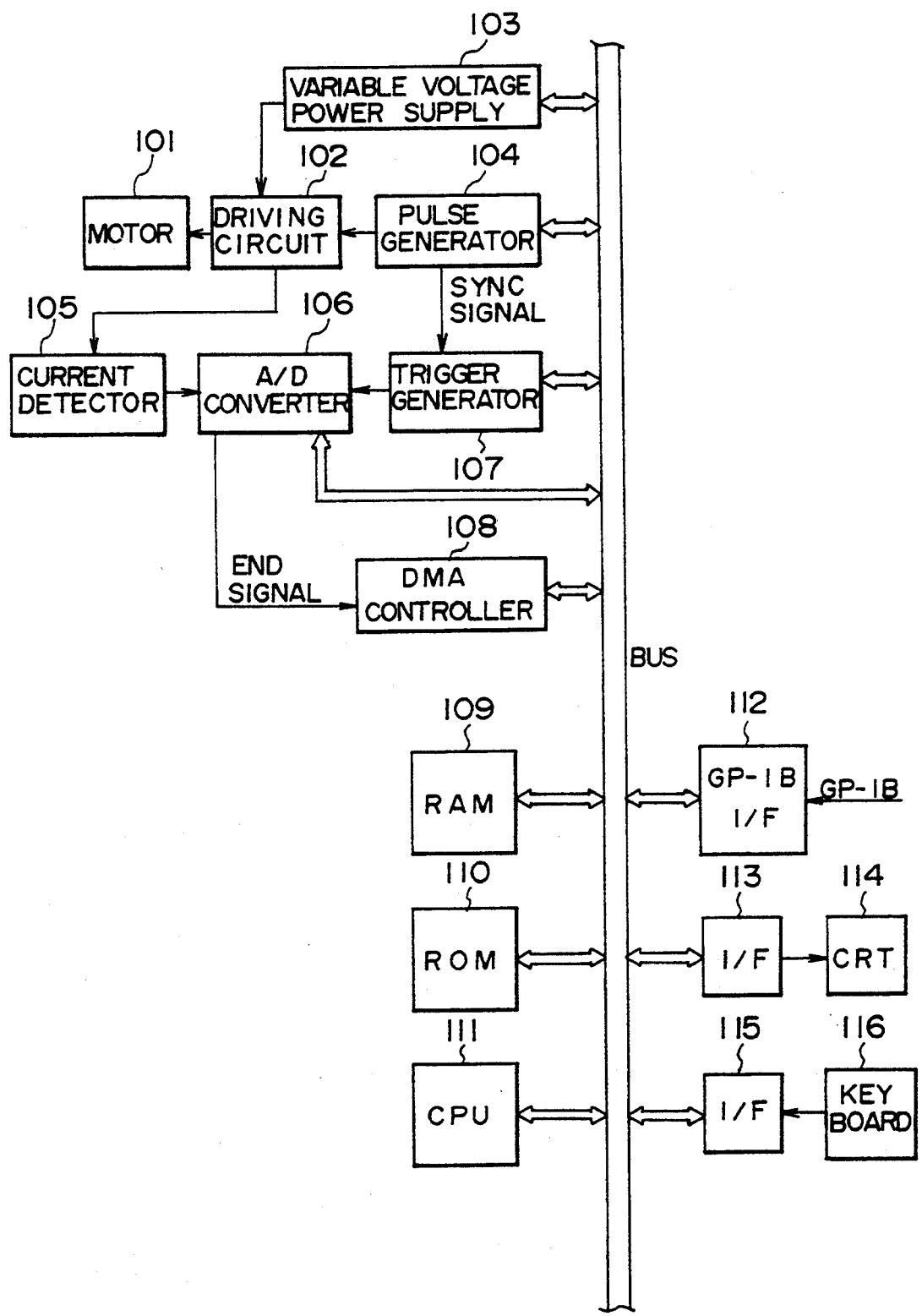
FIG. 8 is a block diagram of computer controlled apparatus for measuring the load torque for a stepping motor according to the present invention.

FIG. 8 illustrates a block diagram of the computer controlled load torque measurement apparatus for a stepping motor according to the present invention. Control and data signals from CPU 111 are sent out through the bus BUS and also, a signal is sent out to the CPU 111 through the bus.

Stored in the ROM 110 is the program to control the present measurement procedures so that the CPU 111 will supply the control signal to each part based on the program.

Power from a variable voltage power supply 103 to be controlled by CPU 111 is supplied to a driving circuit 102 which generates a driving pulse to be applied to the motor 101. Also applied to the driving circuit 102 is a driving pulse from a pulse generator 104 the driving timing of which is controlled by CPU 111. The driving current to flow in the driving circuit 102 is detected by a current detector 105 (corresponding to the current detector 10 in FIGS. 1A–B) before being converted into a digital signal by an A/D converter 106. The digital signal is, then, sequentially stored in RAM 109 by way of the bus under control of a DMA controller 108. The driving timing of the A/D converter 106 is controlled by a trigger signal to be generated by a trigger generator 107 in response to the sync signal from the pulse generator 104. That is, the sampling timing to be generated from the trigger generator 107 is synchronized with the driving pulse for the motor.

An external instruction signal is entered through a keyboard 116 to constitute a man-machine interface by way of an interface (I/F) 115. Similarly, a CRT 114 is connected by way of an interface 113. Also, data transmission and reception with an external computer is performed by way of GP-IB interface 112.

Figure 9:
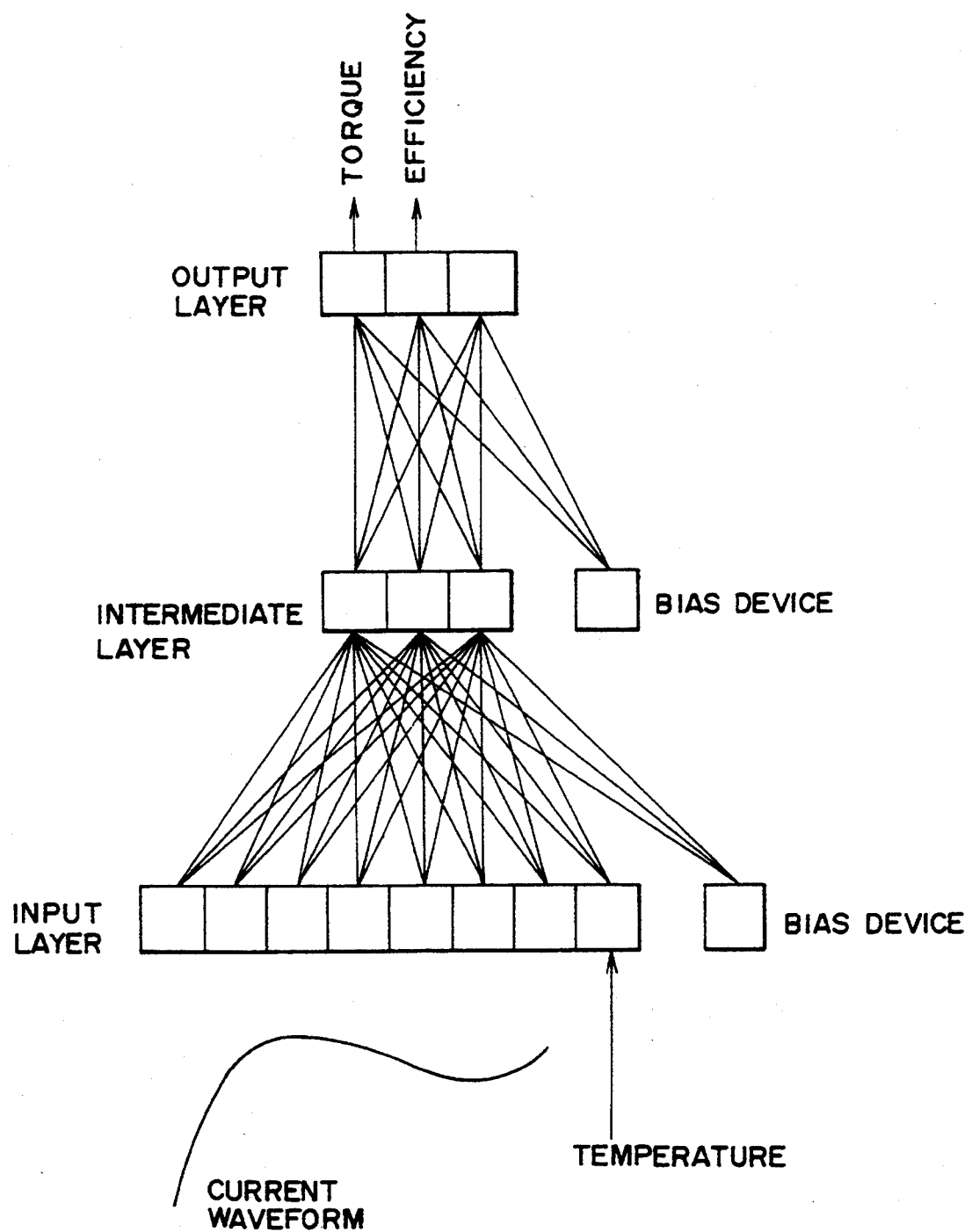
FIG. 9 is a construction diagram of the characteristic extraction portions 13, 15 in the embodiment in FIGS. 1A-B using a nerve circuit network.

FIG. 9 illustrates an example of a neuro circuit network to achieve the feature extraction portions 13, 15 in FIGS. 1A–B.

In FIG. 9, sample values of the above driving current and temperature are given to an input layer comprising a desired number of elements. Each output from the input layer is coupled to an intermediate layer also comprising a desired number of elements. Outputs from the intermediate layer are coupled to an output layer comprising a desired number of elements. Bias devices are used to supply proper bias to the intermediate and output layers. As known in the art, an appropriate teaching signal is applied to the neuro circuit network to repeat learning. In this way, when a similar pattern is applied to the input layer, a proper output is extracted as a result of the learning. The algorithm of learning may be a back propagation method.

In this particular embodiment, a plurality of sample values of the driving current when a known torque is applied to the motor under test and the temperature of such motor are given to the input layer in the learning step.

The output from the output layer is compared with the known torque given to the input layer as the teaching signal. If the above learning is repeated on a plurality of torques, the neuro circuit network will be able to measure the output torque or the load torque from the driving current waveform.

Similarly, with additional application of the power supply voltage and the like (not shown) to the input layer, learning and measurements of efficiency of the motor under test or the entire system including the driving circuit can be performed.

In accordance with this particular embodiment, it is the general characteristic of the neuro circuit network that effective measurements can be made in a case where a feature in a current waveform is not significant such as in the case of, for example, 1–2 phase driving or fine step driving of the motor.

As described hereinbefore, the load torque is not always uniform, for example, in the case of a carriage mechanism for a printer, the load torque is heavy during dot printing. However, in accordance with the present invention, the use of the sync signal similar to the motor driving pulse train allows measurement of the curve of change in load torque over the entire stroke permitting determination of the load torque condition at any desired section in the entire stroke by the above sampling technique.

Also, the provision of the peak hold function of the above load current waveform allows knowledge of the location of the heaviest load torque in the entire carriage stroke.

Additionally, in the case of using the present invention for product inspection or quality control applications, the same can be used as a lot management recorder to determine the load torque level of an individual machine in accordance with the serial number of the machines in production.

Alternatively, if a GO/NG function is provided in the reference judgment portion 17, it can be used to judge the adjustment of the assembled machine including the motor.

As understood from the above description, the load torque measurement apparatus for a stepping motor according to the present invention measures unique parameters in the torque and the stepping motor driving current or voltage in advance in order to obtain the torque vs. unique information relation data showing the torque vs. driving current/voltage characteristic information. Subsequently, the above characteristic parameters are measured while applying the actual load to the stepping motor installed with the actual mechanical components. The actual load is measured by comparing the obtained characteristic parameters with the torque vs. characteristic information relation data, thereby enabling measurement of the load torque required by the mechanical portion installed with the stepping motor without disassembling the mechanical portion. As a result, characteristics of the load mechanical portion of the motor and the coupling condition between the mechanical portion and the motor can be objectively determined at any step from development and quantity production of the stepping motor applied machines.

In other words, the present invention enables one to eliminate the need for any specially made motor and any special tool. It enables quantitative measurement of the load torque of the output shaft of the actual motor in development or quantity production. The resulting advantages of the present invention include:

(1) Since not only the torque generated by a motor but also the load torque can be quantized, the torque margin can be defined by calculating the difference between these two torques, thereby realizing stable mass production of stepping motor applied products free from any torque trouble.

(2) By defining the minimum and optimum torque margin to avoid over specification of the motor, it is possible to miniaturize the motor and the machine using such motor while providing reduced cost.

(3) It is possible to realize reasonable design, production and adjustment by enabling detailed analysis of factors affecting the load torque of each part, such as accuracy of parts, backlash, tension of the timing belt or wire, pressure of rollers, etc.

(4) It achieves reasonable design due to analysis of the influence to the load torque of the mechanical components driven by the stepping motor and any parts operating in synchronism therewith and also the load torque distribution.

Figure 10:
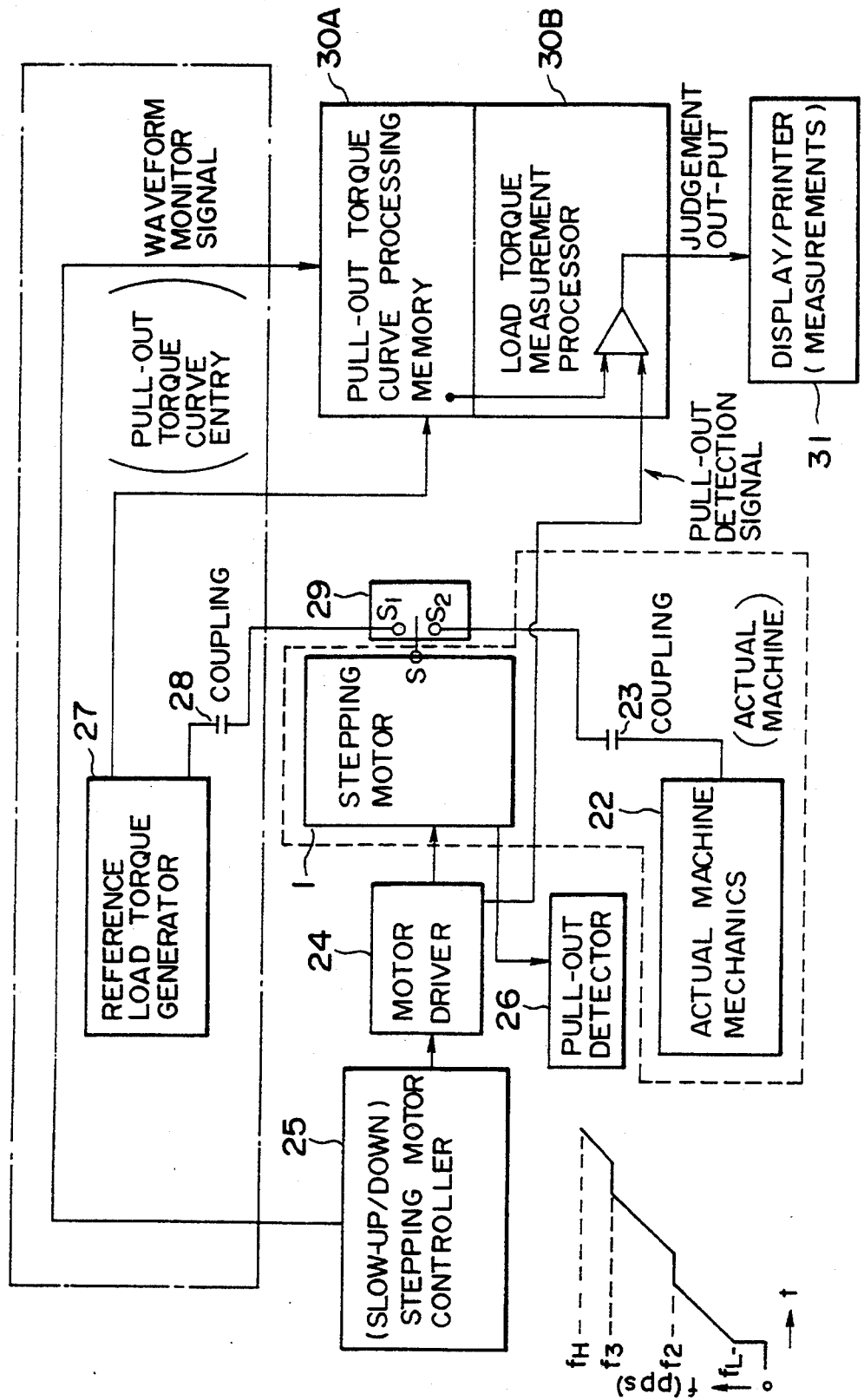
FIG. 10 is a block diagram to illustrate one embodiment of the load torque measurement apparatus for a stepping motor according to the present invention.

Now, illustrated in FIG. 10 is a block diagram of another embodiment of the load torque measurement apparatus for a stepping motor according to the present invention.

Normally, when a stepping motor is revolving at a certain frequency and the load torque applied to the motor shaft is gradually increased, the motor stops revolving or is in asynchronism with the applied driving pulse. This phenomenon is generally referred to as "pull-out" and the maximum torque immediately before the pull-out occurs is referred to as the pull-out torque.

This particular embodiment of the present invention measures the load torque by utilizing the fact that pull-out occurs when the load torque of a stepping motor coincides with the pull-out of the revolving motor. It has been discovered that the frequency vs. pull-out characteristic fluctuates about ±10% and ±5% for PM type and HB type stepping motors, respectively. On the other hand, the load torque may fluctuate about ,±100% due to the way of assembling the stepping motor and mechanical adjustments. Thus the frequency vs. pull-out characteristic can be utilized for the load torque measurement.

Figure 11:
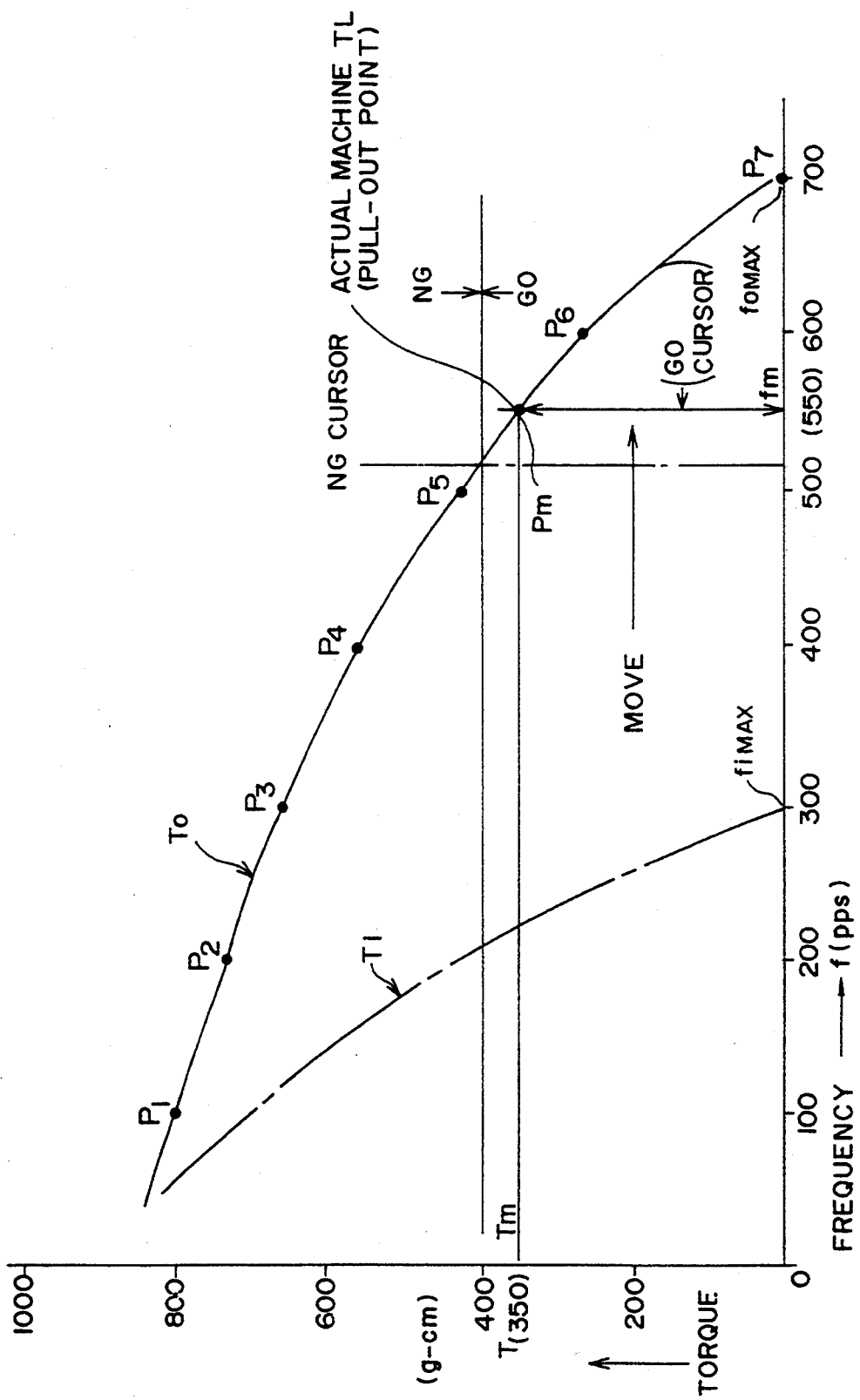
FIG. 11 is a graph of a frequency vs. pull-out torque characteristic to explain the measurement principle of the load torque measurement apparatus for a stepping motor according to the present invention.

FIG. 11 is a graph of one example of the frequency vs. pull-out characteristic of a stepping motor. The horizontal axis represents the frequency f (PPS) of the driving signal to the motor while the vertical axis represents the torque T (g·cm). Shown by T0 is the pull-out curve which is obtained by interpolating the points P1, P2, P3, P4, P5, P6 and P7 corresponding to torque values at the frequency of 100 (PPS), 200 (PPS), 300 (PPS), 400 (PPS), 500 (PPS), 600 (PPS) and 700 (PPS), respectively. The 700 (PPS) is the maximum continuous response frequency f0max under the no load condition.

The pull-in torque curve Ti represents the maximum torque at associated frequencies available at the start or stop of a motor. The no-load maximum self-started frequency fimax is 300 (PPS). This pull-in torque curve shows that the motor cannot be started or stopped at any frequency exceeding the fimax.

In FIG. 10, mechanical coupling between the stepping motor and the reference load torque generator or the actual mechanical component is represented by a switch 29 for ease of understanding. The switch 29 is used to select the measurement function. If the stepping motor 21 is coupled to one terminal S1, the above mentioned frequency vs. pull-out characteristic is obtained. If the switch 29 is connected to the other terminal S2, the load torque of the actual machine can be measured.

Firstly, the selection switch 29 is connected to terminal S1 so as to couple the stepping motor 21 to the reference load torque generator 27 by way of a coupling 28. The reference torque generator 27 may be a torque meter available from Vibrac Corporation in the United States for enabling the measurement at the ±0.5% accuracy of the load torque full scale.

A motor driver 24 receives a slow up/down control signal from a stepping motor controller 25 and supplies a corresponding driving signal to the stepping motor 21 to control the same accordingly. The control signal from the stepping motor controller 25 changes the frequency of the driving signal in a step manner. Connected to the stepping motor 21 is a pull-out detector 26 to detect pullout of the stepping motor 21 for measuring the pull-out torque points P1 through P7 at a frequency as illustrated in FIG. 11 by utilizing the load torque from the reference load torque generator 25 and the frequency data of the driving signal (a frequency monitor signal from the stepping motor controller 25). The measured data is entered in a pull-out torque curve processing memory 30A to obtain the reference pull-out torque curve by performing proper interpolation between adjacent pull-out torque points to be stored in the memory. Alternatively, the reference pull-out torque curve may be manually generated and stored in memory rather than determined by an automatic procedure.

Measurements of the load torque of the motor output shaft for the stepping motor assembled to the actual mechanical components are carried out in the following steps. The stepping motor 21 is a stepping motor of the same specification as the one used for obtaining the pull-out torque curve. Also, the motor driving conditions must be the same as those employed in the above referenced pull-out torque measurement procedures.

The selection switch 29 is connected to the terminal S2 to couple the stepping motor 21 to the actual mechanical component 22 by way of a coupling 23.

The frequency is slow-up controlled by the control signal from the stepping motor controller 25. The stepping motor 21 is driven to gradually increase the revolution speed via motor driver 24 until pull-out of the stepping motor occurs at a certain frequency. The pull-out is detected by the pull-out detector 26. It is assumed that pull-out of the stepping motor occurred at point Pm on the reference pull-out torque curve in FIG. 11. A pull-out detection circuit from the pull-out detector 26 is sent to the load torque measurement processor 30B. The slow-up frequency fm (PPS) at this point is latched. The load torque measurement processor 30B sends the pull-out torque Tm (g·cm) as the load torque TL to an output device 31 such as a display or a printer. The pull-out torque Tm (g·cm) is determined by reference to the pull-out detection signal (the latched frequency) and the reference pull-out torque curve data from the pull-out torque curve processing memory 30A.

For example, a motor having the pull-out torque curve characteristic as shown in FIG. 11 is assembled to a paper feed driver for a printer. The motor is started at 100 (PPS) with sufficient torque margin and undergoes the slow-up control in which the frequency is gradually increased. Assuming that the pull-out occurred at 550 (PPS), the load torque is determined to be 350 (g·cm) because the pull-out torque at 550 (PPS) is 350 (g·cm) from FIG. 11.

There are several ways of detecting pull-out by the pull-out detector 26 in FIG. 10:

(1) Visually detecting the revolution of the motor output shaft.

(2) Employing a reflection type revolution detector to detect the reflection from a marker having a light reflection member mounted on the motor output shaft.

(3) Employing a revolution detection to monitor the counter electromotive force generated in the motor coil.

(4) A motor coil current detection method to detect sudden increase of the current level in the motor coil when pull-out occurs.

It is now understood that the load of a stepping motor is not only the load torque but also the load inertia. An acceleration torque is required in order to accelerate the load inertia. The acceleration torque is defined by the error in measurement of the present invention. An acceleration torque Ta is expressed by the following general expression:

$$Ta = [(JR + JL) \cdot 2\pi \cdot (f2 - f1)]/n\theta \cdot tACC \text{ (g·cm)}$$

where,

JR is a rotor inertia of a motor (g·cm−S$^2$),

JL is the load inertia (g·cm-S$^2$), (f2−f1) is the differential frequency from a low frequency, f1 (PPS) to a high frequency f2 (PPS), $n\theta$ is the number of revolution steps of the stepping motor (steps/rev.), and tACC is the time (seconds) required for (f2−f1). For example, in a typical motor with size of Φ55×L25, step angle 7.5°/step, the rotor inertia JR is:

$$JR = 40 \times 10^{-3} \text{ (g·cm−S}^2\text{)}.$$

If (f2−f1) is 100 (PPS), tACC is 1 (sec), $n\theta$ is 48 and JL is equal to JR and $40 \times 10^{-3}$ (g·cm−S$^2$), the acceleration torque Ta is expressed by the following expression:

$$Ta = (80 \times 10^{-3} \times 2\pi \times 100)/48 \times 1$$

That is, Ta is essentially 1.0 (g·cm). If it undergoes slow-up to increase the frequency 100 (PPS) per second, the acceleration torque error for the 350 (g·cm) load torque is 1.0 (g·cm) or 0.3% and can be negligibly small.

The pull-out torque curve of a stepping motor is slightly variable due to temperature increase of the motor. However, the temperature change does not affect the measurements if the measurement is carried out in a short time, for example, within 2 minutes. The temperature of a stepping motor is normally saturated in about 1 hour.

It is to be understood that more accurate measurement can be made by taking the temperature rise into consideration. That is, the influence of the motor temperature rise on the pull-out torque curve is measured in advance.

It is also possible to perform data processing of the motor temperature rise and the change in torque curve by using a computer, thereby automatically correcting the torque curve in accordance with measured temperature.

FIG. 12 shows an example of the load torque measurement apparatus for a stepping motor mounted on a facsimile transmitter as a practical application of the present invention.

Mounted on the output shaft of the stepping motor 43 is a motor pinion gear 44 to rotate a transmitter platen roller 42 by way of speed reduction gears 45, 46 and 47 or a speed-up gear 48. The platen roller 42 is in close contact with the image sensor 41 by applying pressure F. Inserted between the platen roller 42 and the image sensor 41 is an original document (not shown) to be read by the image sensor 41 for transmission as an image data. The load torque of the stepping motor 43 depends on various factors such as the accuracy and intermeshing of the gears, parallelism of the motor shaft and the other shafts to which the motor shaft is to be coupled, roundness of the platen roller 42, pressure F applied to the contact image sensor 41, the friction coefficient between the platen roller 42 and the image sensor 41 with no original document therebetween, the friction coefficient between the original document and the image sensor 41, etc. The intermeshing between the motor pinion gear 44 and the first stage gear 45 largely affects the load torque.

Figure 13:
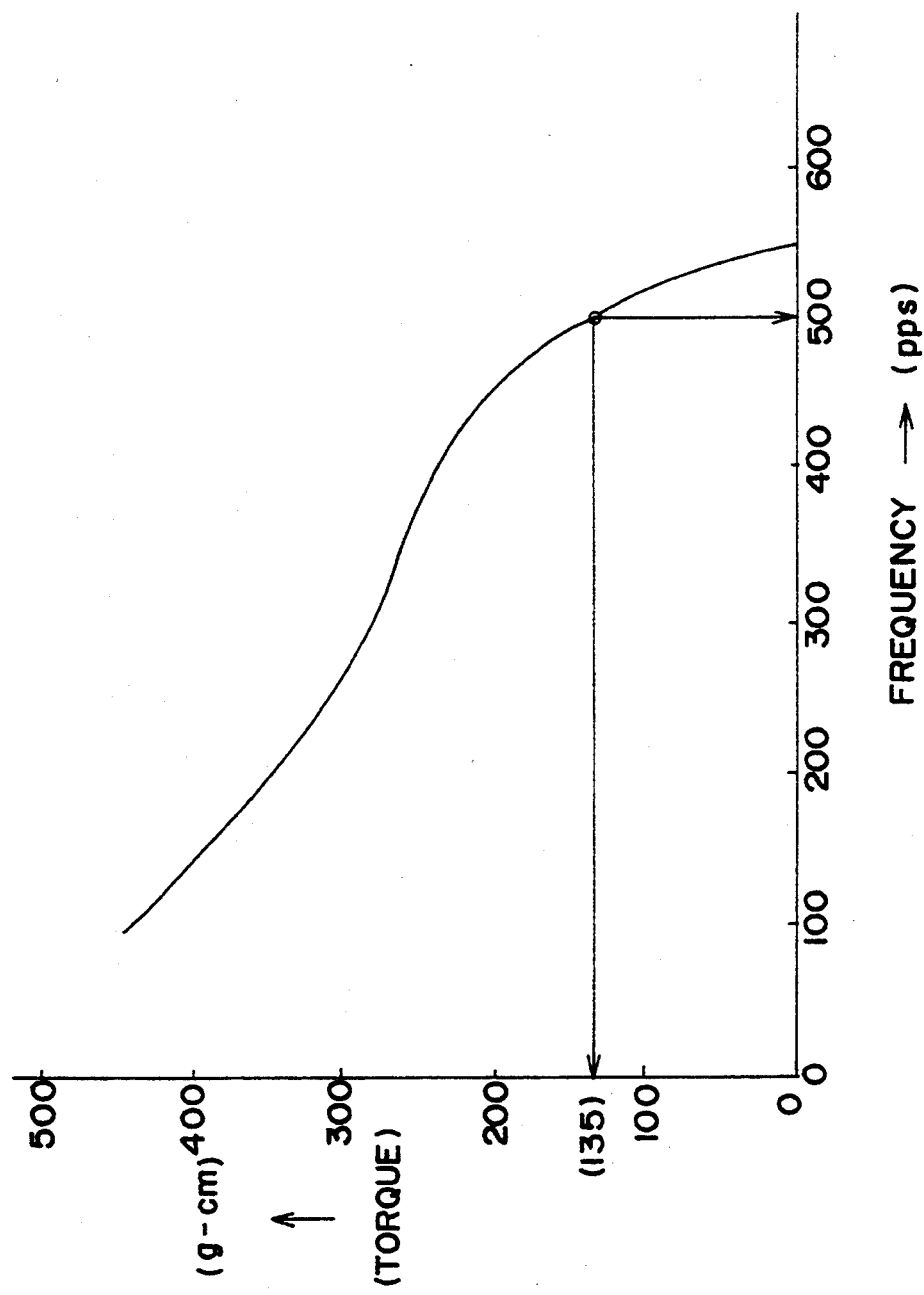
FIG. 13 is a frequency vs. pull-out torque characteristic curve obtained from the example in FIG. 12.

A frequency vs. pull-out torque characteristic curve of the motor as assembled in FIG. 12 is illustrated in FIG. 13. The assembled motor is started at 50 (PPS) and the frequency is gradually increased until pull-out occurs at 500 (PPS). It is understood by referring to FIG. 13 that the pull-out torque at a frequency of 500 (PPS) is 135 (g·cm) and thus the load torque is equal to 135 (g·cm).

The load torque measurement by the above mentioned revolution limit method of a stepping motor according to the prevent invention is carried out in the following steps. Firstly, a driving method of a stepping motor (exciting circuit arrangement, driving voltage and exciting mode) is determined. The "frequency vs. pull-out torque curve" of the motor in question is accurately measured using a measuring instrument. A continuous curve of the frequency to pull-out torque is generated by entering about 10 points at different frequencies including the maximum continuous response frequency and also by interpolating between adjacent points. A cursor is used to enter the lower NG limit. Then, the motor having a pinion gear is set to the mechanical components.

To start the measurement, the frequency cursor is moved, pull-out is detected in the above mentioned manner, the pull-out frequency is stored and then the load torque is determined at the cross point of the pull-out frequency and the torque curve. GO/NG information and/or the load torque is printed out. It is noted that the measurement must be made in a short time (for example, within 2 minutes) in order to avoid change in "f−T0 characteristic" due to temperature rise. Also, it is to be noted that the frequency is gradually increased (slow-up) to avoid acceleration torque.

The stepping motor to be set to the mechanical component under test may be different from the stepping motor used to define the above "frequency vs. pull-out torque curve". Accordingly, if the "frequency vs. pull-out torque curve" is once defined, the load torques of other motors assembled with respective mechanical components can be measured without directly measuring the pull-out frequencies of each motor.

Now, described hereunder is a method of measuring the load torque to the output shaft of a stepping motor by varying the driving voltage for the motor to cause the pull-out torque curve to change.

Figure 14:
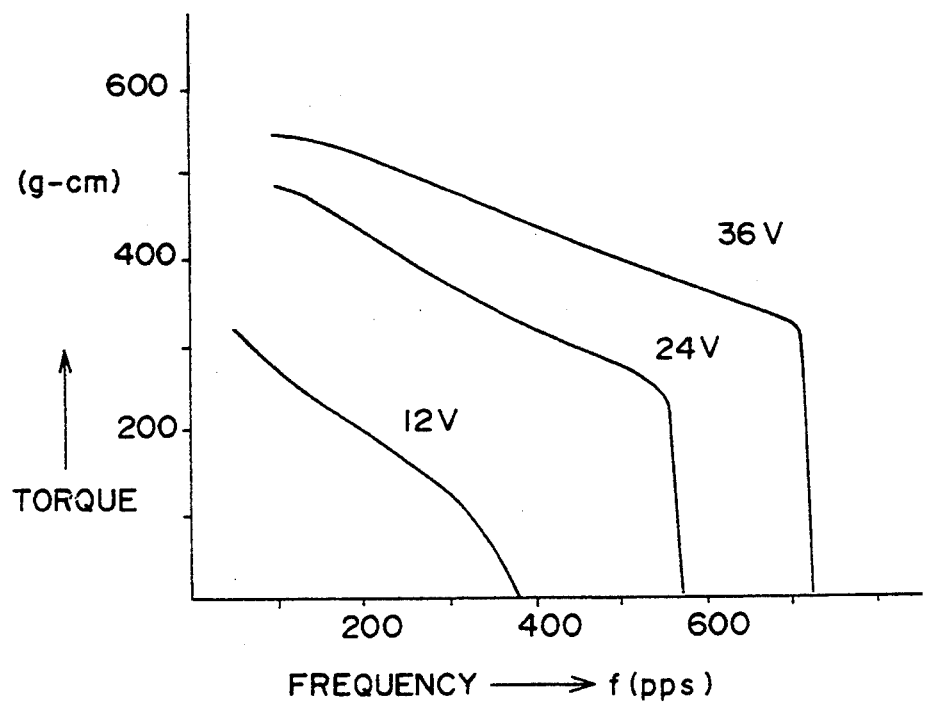
FIG. 14 illustrates pull-out torque curves at different motor driving voltages for explaining another embodiment of the load torque measurement apparatus for a stepping motor according to the present invention.

Shown in FIG. 14 are the pull-out torque curves when the motor driving voltages are 12, 24, and 36 volts, respectively. The motor is a PM type stepping motor which is Φ42×L22 in size, 7.5°/step in step angle, 70 Ω/phase in coil resistance and 12 volts in voltage rating. It was unipolar driven in 2—2 phase excitation.

Figure 15:
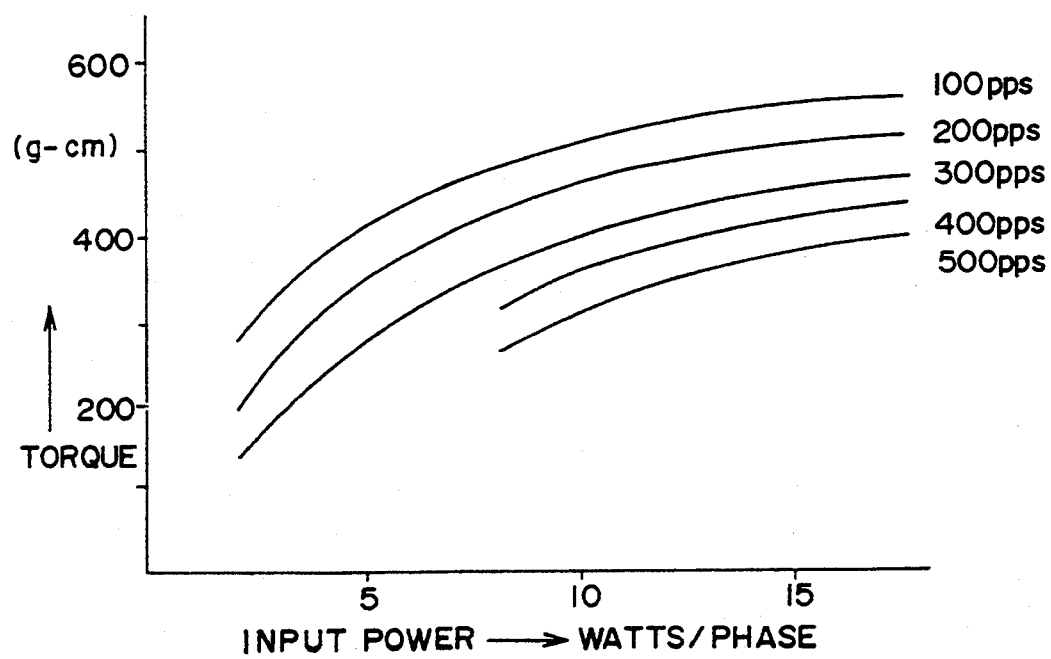
FIG. 15 illustrates the relationship between the input and torque according to frequency from FIG. 14.

Shown in FIG. 15 is an arrangement of FIG. 14 and illustrating graphs of the input power vs. torque characteristics, with frequency as a parameter. The horizontal axis represents the input power P (watts/phase) when the motor is stationary. The input power P=V$^2$/R, where V is the driving voltage in volts and R is the coil resistance in ohms/phase.

In the present invention, the characteristic curves in FIG. 15 are stored in the processing memory in a similar manner to the above invention. An interpolation technique is employed to obtain intermediate frequencies such as 150 (PPS) between 100–200 (PPS).

Now, when the motor is driven to rotate the load by driving it at, for example, 200 (PPS) in frequency, 2—2 phase excitation and 30 volts in driving voltage, the driving voltage is gradually decreased until pull-out occurs in the motor. It is assumed that the pull-out occurred at the driving voltage of 16.7 volts equal to P=4 (watts/phase). The pull-out torque and thus the load torque is determined to be 300 (g·cm) by reference to the curves in FIG. 15 at P=4 (watts/phase) and 200 (PPS) in frequency.

Although the motor load torque is measured using the driving frequency as the factor in the above invention, the motor shaft load torque is measured using the motor driving voltage as the factor in the present invention.

The pull-out detector, the reference load torque generator and the load torque measurement processor may be identical to those as described above for the present invention.

Now, still another embodiment of measuring the load torque from the loaded self-starting frequency is described in detail.

As a result of various experiments, assuming the loaded self-starting frequency to be fs (PPS), the pull-out torque at fs (PPS) to be T0 (g·cm), the rotor inertia of the stepping motor to be JR (g·cm−S$^2$), the load inertia to be JL (g·cm−S$^2$), the number of steps per complete revolution to be nΘ (STEPS/REV), and the constant at unipolar driving 2—2 phase excitation to be $\beta$, it has been found that the load torque TL (g·cm) is given by the following expression:

$$TL = T0 - [(JR+JL) \times 2\pi \times fx^2]/(n\theta \times \beta) \quad \ldots (1)$$

Experiments show that $\beta$ is best to be set to 2.3.

The way of obtaining the pull-out torque curve is the same as described above. In case of the fixed motor driving voltage, the self-starting frequency is increased gradually. The load torque is measured by an automatic calculation from the above expression (1) using the pull-out frequency f (PPS).

On the other hand, in the above variable motor driving voltage method, the loaded self-starting frequency is fixed and the motor driving voltage is gradually reduced to decrease the pull-out torque. Then, the load torque is measured by automatic calculation from the above expression (1) using the pull-out frequency f (PPS).

As described above, the load torque measurement apparatus for a stepping motor according to the present invention measures the frequency vs. pull-out torque characteristic of a stepping motor in advance. In actual measurements, the motor is driven from a low frequency to a high frequency to measure the actual load torque based on the frequency where pull-out has occurred and the above frequency vs. pull-out torque characteristic. As a result, the characteristic of the mechanical load portion for a motor and the coupling condition between the mechanical load component and the motor can be objectively evaluated to determine if they are good or bad.

In the present invention, the actual load can be measured by first measuring and storing the features in the coil current when the load torque generated by a reference load torque generator is applied to a stepping motor in the same manner as described above. Then, the actual mechanical component or machine to provide a desired load condition is coupled to the stepping motor to measure the driving current waveform. The actual load is measured by comparing the obtained features in the coil current with respect to the above stored features. It is to be noted here that a sufficient driving voltage not causing pull-out in the stepping motor is applied in order to ensure high measurement accuracy in the load torque. It is also possible to make the features in the driving signal waveform more significant by integrating the driving current in the coil over a desired range.

Now, one embodiment of the inertia moment measurement apparatus for a stepping motor according to the present invention will be described. As is well known, the influence of the inertia moment of the load is negligible and no load torque is required as long as the load keeps revolving at a constant rate. However, if the revolution tends to change, an additional load torque equal to the acceleration multiplied by the inertia moment is required (and if the speed goes down, surplus torque results).

Figure 16:
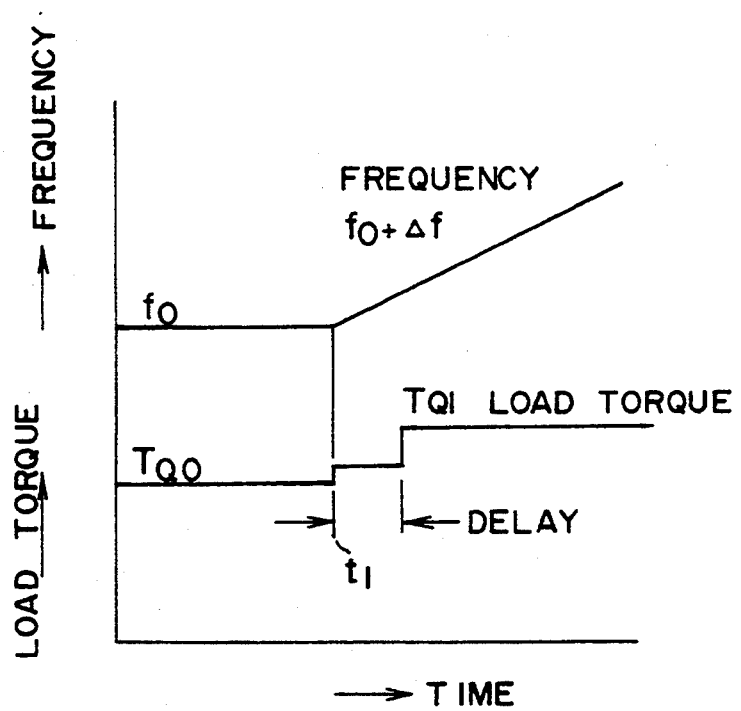
FIG. 16 is a graph to explain the operation of measuring the load torque.

Shown in FIG. 16 is a graph to explain the operation of the load torque measurement according to the above idea. The load is revolving at a constant speed at time t1. A torque TQ0 is applied to the load at this time t1. When the frequency starts to increase at a constant acceleration from the time t1, the load torque TQ1 will be increased by the amount equal to the inertia moment of the load multiplied by the acceleration. Accordingly, the inertia moment of the load can be obtained by the difference (TQ1−TQ0) divided by the acceleration.

Actually, there are complicated gear mechanisms, etc. between the output shaft and the load, thereby causing certain time lag (propagation delay) to have the effect of frequency change at time t1. This indicates that the inertia moment can be determined by measuring the propagation delay of the load.

Figure 17:
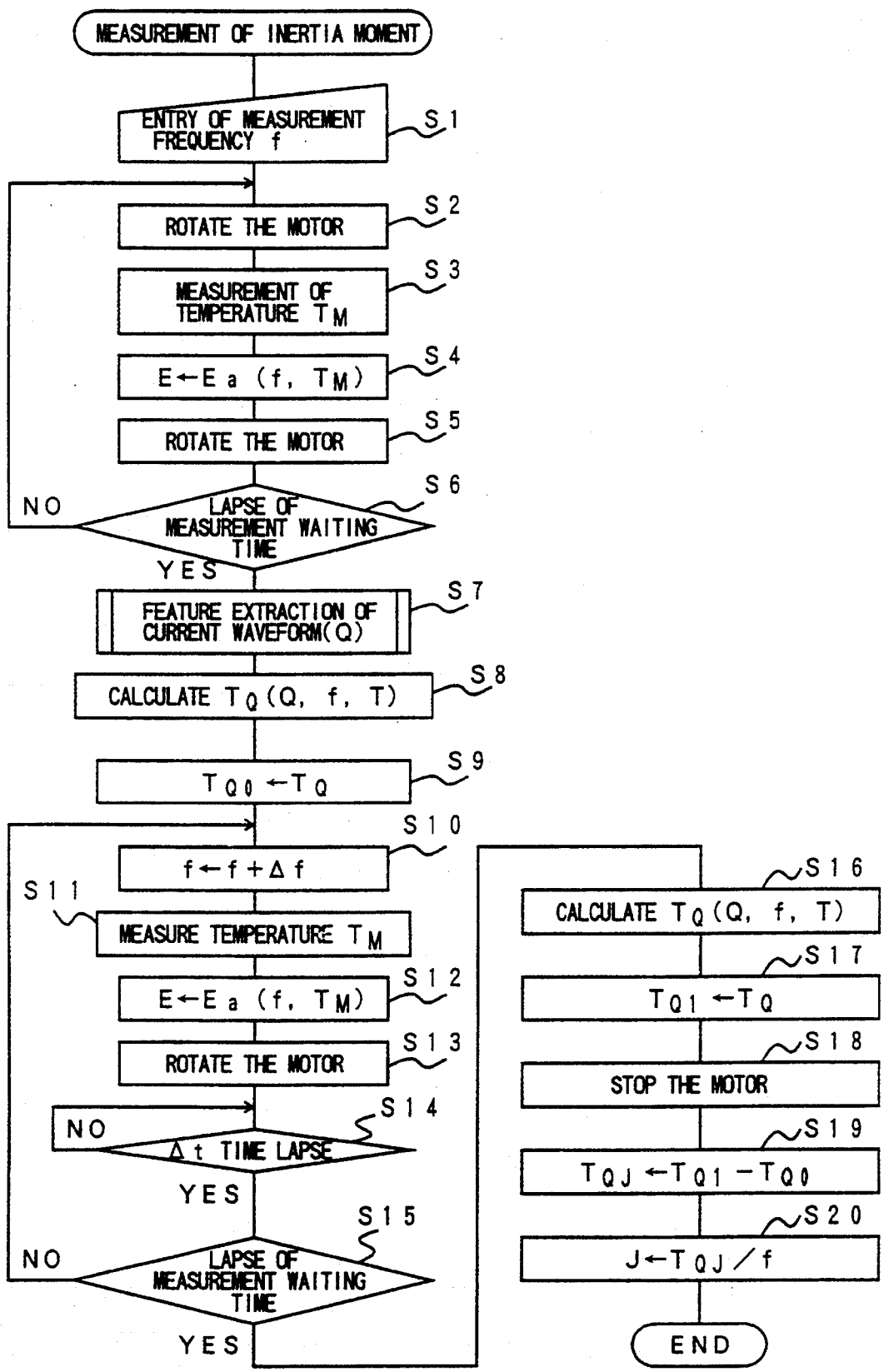
FIG. 17 is a flow chart to show the steps of measuring the inertia moment of an instrument to be measured according to the present invention.

An embodiment of measuring the inertia moment of a machine under control will be described by reference to FIG. 17. The basic principle of measurement is the same as the above. That is, the torque required to drive the mechanical part at a constant acceleration subtracted by the torque required for driving it at a constant revolution rate is the torque required to accelerate the inertia moment of the mechanical part.

A first step is to designate the measurement frequency (step S1). The same type of motor as used for calibration is assembled to the mechanical part under measurement and is controlled to revolve until the load torque stabilizes at frequency f while applying a predetermined driving voltage E with the temperature TM as a parameter (steps S2 through S6). When stabilized, the load torque TQ0 is measured (steps S7 through S9).

Next, steps are taken to increase the motor speed at a constant rate (a group including steps S10 and S14). Added is the load torque to accelerate the inertia moment of the mechanical part under measurement. Although the torque required to accelerate the inertia moment of the motor itself is added, the inertia moment of the motor is known and can be subtracted from the measurement if necessary. Similarly, a waiting period allows the revolution of the motor to stabilize. After the waiting time, the load torque TQ1 is measured based on the feature in the driving current waveform at this time (steps S11 through S17). It is needless to say that the load torque is subtracted if the number of revolutions is decreased rather than increased.

Also, the frequency change in the measurement of the incremental load torque is quite small so that the measurement at the constant number of revolutions is meaningful.

After completing the above two measurements, the incremental load torque required to accelerate the inertia moment is detected as TQJ=TQ1−TQ0 (steps S18 and S19). The inertia moment in question can be calculated by the incremental load torque TQJ divided by the acceleration f' applied to the mechanical part (step S20).

An output measurement apparatus for a stepping motor is described hereunder. This embodiment is an apparatus to measure efficiency of the motor under measurement or the motor and its associated driving circuit.

Figure 18:
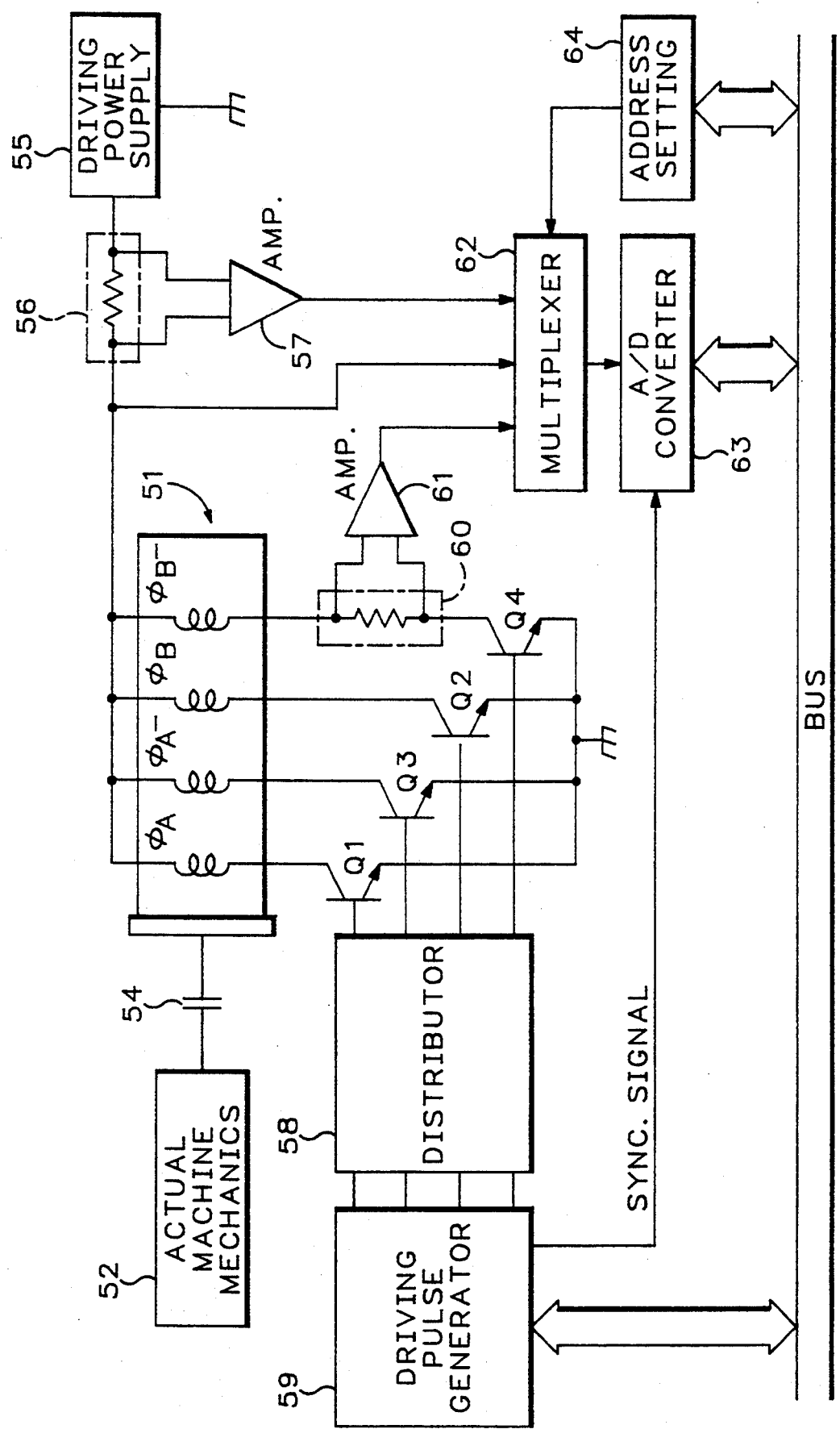
FIG. 18 is a block diagram of efficiency measurement apparatus according to one embodiment of the present invention.

Illustrated in FIG. 18 is a block diagram of the efficiency measurement apparatus. In addition to a driving pulse generator 59 for driving the motor under measurement and driving current detection means (a current sensing resistor 60 and an amplifier 61) for detecting the driving current from a driving power supply 55, this embodiment utilizes a multiplexer 62 to receive the outputs from the power supply current detection means (a current sensing resistor 56 and an amplifier 57) and the power supply voltage. The output from the multiplexer 62 is digitized by an A/D converter 63 before being sent to the bus under control of the CPU. It is to be understood that the measurement channel of the multiplexer 62 is selected by address setting 64 under control of CPU. In FIG. 18, indicated by reference numerals 51, 52 and 54 are a stepping motor, an actual mechanical part and coupling, respectively.

Now, the actual input power to the motor under measurement 51 in FIG. 18 is measured as follows:

In the example in FIG. 18, the instantaneous current in the phase ΦB− of the motor 51 is measured. Simultaneously, the instantaneous voltage applied to the motor is also measured. Such instantaneous current and voltage are digitized and stored in a RAM. The input power to the phase ΦB− is obtained by integrating the product of the instantaneous current in the phase ΦB− and the instantaneous voltage of the power supply for the time interval when the transistor Q4 is on or conducting. For simplicity, the voltage drop by the transistor Q4 is assumed to be negligible. However, if necessary, such voltage drop across the transistor Q4 can be subtracted from the power supply voltage for more accurate power measurement.

The operations of all phases ΦA, ΦA−, ΦB, ΦB− are exactly identical except for phase difference in time. The entire power received by the motor under test during a series of driving pulses can be obtained by quadruplicating the above measurement. It is of course possible to measure instantaneous currents or powers of the 4 phases.

On the other hand, the mechanical power from the motor is obtained by the product of the number of revolutions and the output torque of the motor. Then, the motor efficiency can be calculated by the ratio of the mechanical power and the input electric power of the motor.

It is also understood that efficiency of the overall system including the motor driving circuit can be measured in the present invention. For this end, the instantaneous current from the power supply instead of the current in the phase ΦB− of the motor is detected and measured by the current sensing resistor 56 and the amplifier 57. The product of the instantaneous voltage and current is integrated over a predetermined time period to measure the input power from the power supply. The mechanical power from the motor under test can be determined in the same manner as mentioned above. Then, the overall efficiency of the system can be calculated in the above manner.

Figure 19:
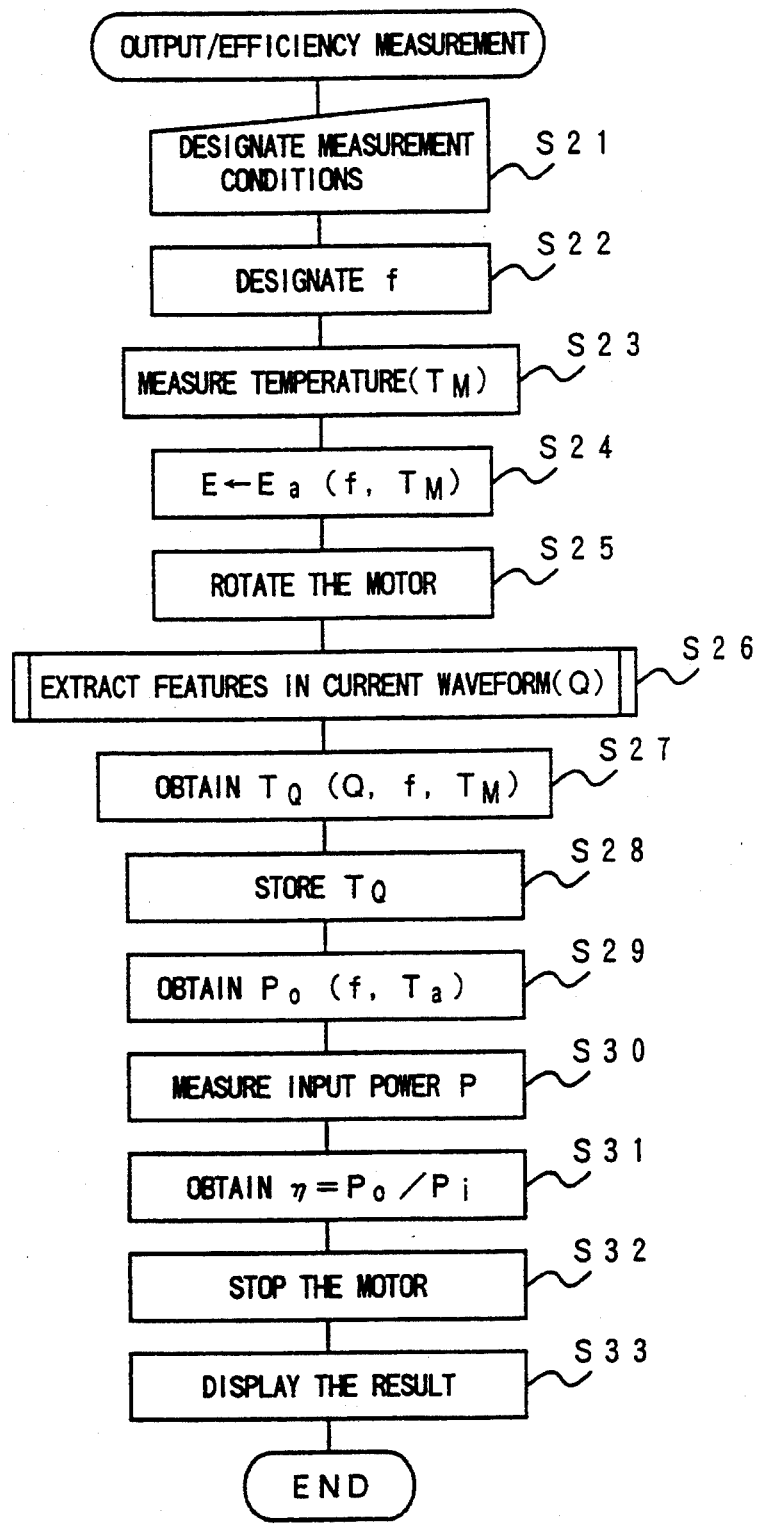
FIG. 19 is a flow chart to show the steps of measuring the mechanical output and efficiency of an assembled motor.

As understood from the above description, the load torque can be measured using the motor assembled with the actual mechanical part. This can be utilized to measure the mechanical output and efficiency of such assembled motor as described hereunder by reference to FIG. 19.

A first step is to designate the measurement conditions (step S21). A next step is to designate the frequency f to feed the motor (step S22). Then, temperature TM is measured (step S23) and an optimum driving voltage E is applied to the motor depending on the f and TM (step S24). Start revolving the motor (step S25), measure the current feature Q (step S26), obtain the load torque TQ (step S27) and store the result (step S28). Then, the motor output P0 is calculated from the product of the load torque TQ and the number of revolutions of the motor (step S29). If necessary, the input power Pi to the driving circuit for the motor is measured (step S30). Efficiency $\eta$ of the system is calculated by the ratio of P0 and Pi (step S31). After completion of the measurement, the motor is permitted to stop (step S32) and the result is displayed (step S33).

As apparent from the above description, the output measurement apparatus for a stepping motor according to the present invention is capable of measuring the output or efficiency of the stepping motor as applied to machines or apparatus with a high degree of accuracy which was difficult to measure directly.

Additionally, the backlash measurement apparatus for a stepping motor according to the present invention will be described hereunder.

Figure 20:
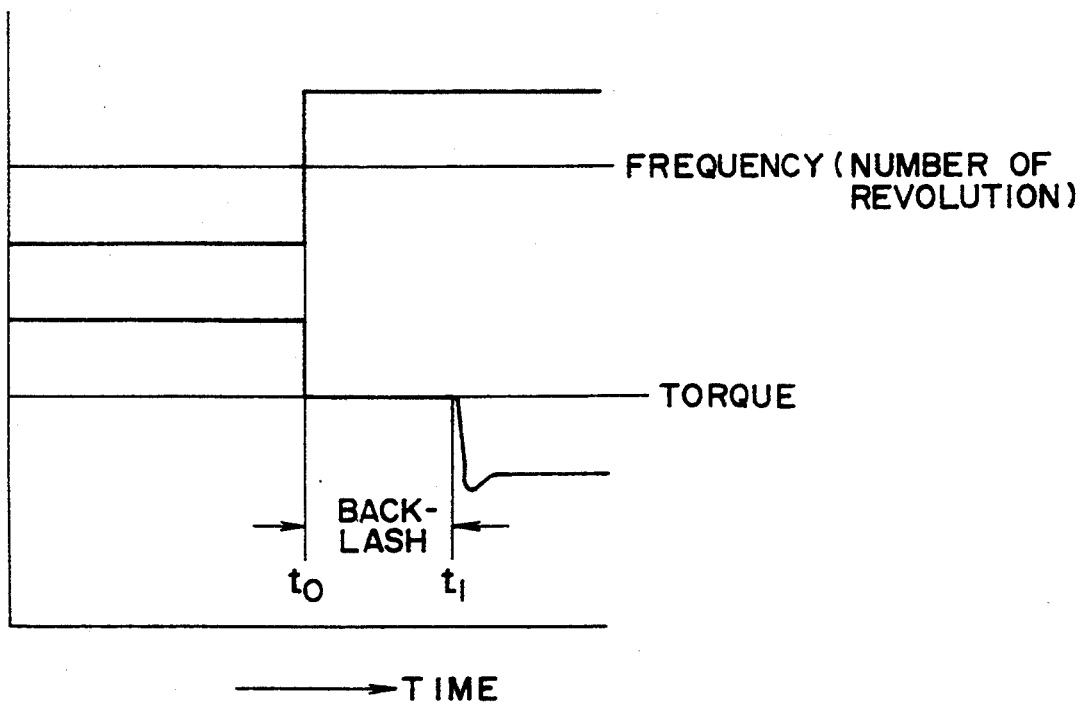
FIG. 20 shows waveforms to explain the principle of backlash measurement according to one embodiment of the present invention.

FIG. 20 shows a graph to explain the backlash measurement apparatus for a load to be measured. The motor is assumed to rotate a load at a constant frequency within a self-starting operation range of the motor. The motor is controlled to revolve suddenly in the reverse direction at time t0. The number of revolutions in the reverse direction is not critical but is typically at the same speed as in the normal (initial) direction. The load mechanical part of the motor generally has backlash, thereby causing a certain time lag before the load torque of the motor changes at time t1. It is of course not so simple as shown in FIG. 20 because of complicated mechanism of the actual mechanical part. However, the time t1 can be determined easily if the torque required by the load is known at the given number of revolutions per second. In the above example, the time t1 can be substituted by the number of driving pulses applied to the motor. It is of course possible to stop revolving the motor for a predetermined time after revolution in CW and before revolution in CCW, thereby easily separating differences in the load torque behavior in both directions of revolution.

Figure 21:
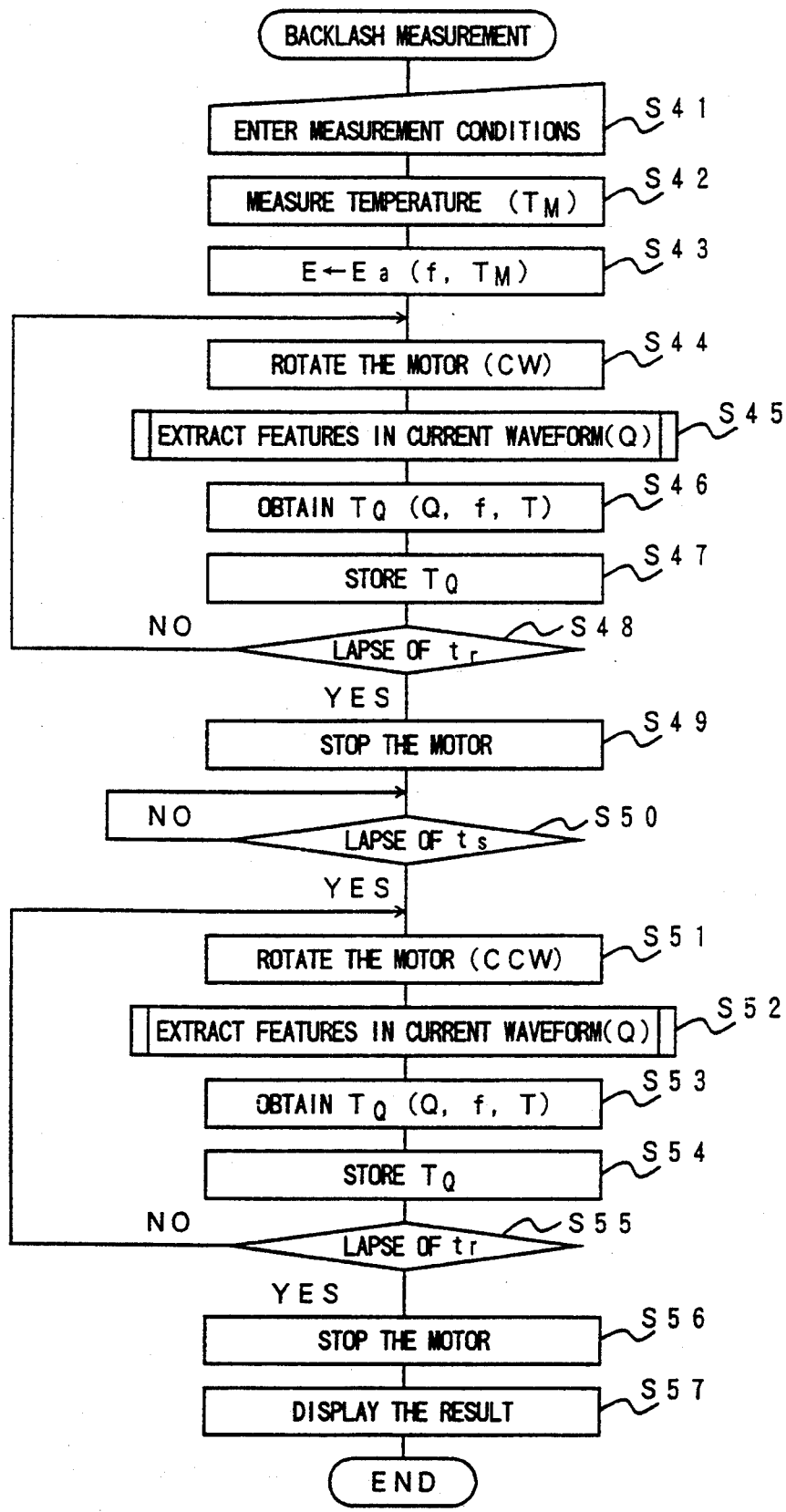
FIG. 21 is a flow chart to show the steps of measuring the backlash of an actual mechanical part according to one embodiment of the present invention.

It has been demonstrated that the load torque required of the motor can be measured when the actual load is applied to the stepping motor. A method of measuring backlash of the actual mechanical part assembled with the motor applying the above load torque measurement will be described hereunder by reference to FIG. 21.

Firstly, designated are the measurement frequency f, times tr for the motor to revolve in CW and CCW (both times may be the same), and the time ts for the motor to be permitted to stop momentarily prior to change in the direction of revolution from CW to CCW (step S41). Then, measure the temperature (step S42), determine and apply the optimum driving voltage (step S43), allow the motor to revolve in CW at frequency f (step S44), extract the feature in the current waveform (step S45), measure the load torque (step S46), and store the load torque TQ (step S47). Time is monitored in step S48 until time tr lapses by repeating the steps S44 through S48.

When the time lapse tr is confirmed, stop the motor for a moment (step S49). Wait until the time ts lapses (step S50) and revolve the motor CCW (step S51). The subsequent steps S52 through S55 are the same as those in the above CW revolution and the load torque in CCW is measured and stored. After completion of the above steps, stop the motor (step S56) and display the measurement result (step S57).

As understood from the above description, the backlash measurement apparatus for a stepping motor according to the present invention provides means to measure the backlash of the mechanical part assembled with the stepping motor with a high degree of accuracy.

Additionally, described hereunder is an embodiment of the present invention to make the driving current waveform more significant in improving the measurement sensitivity.

Figure 22:
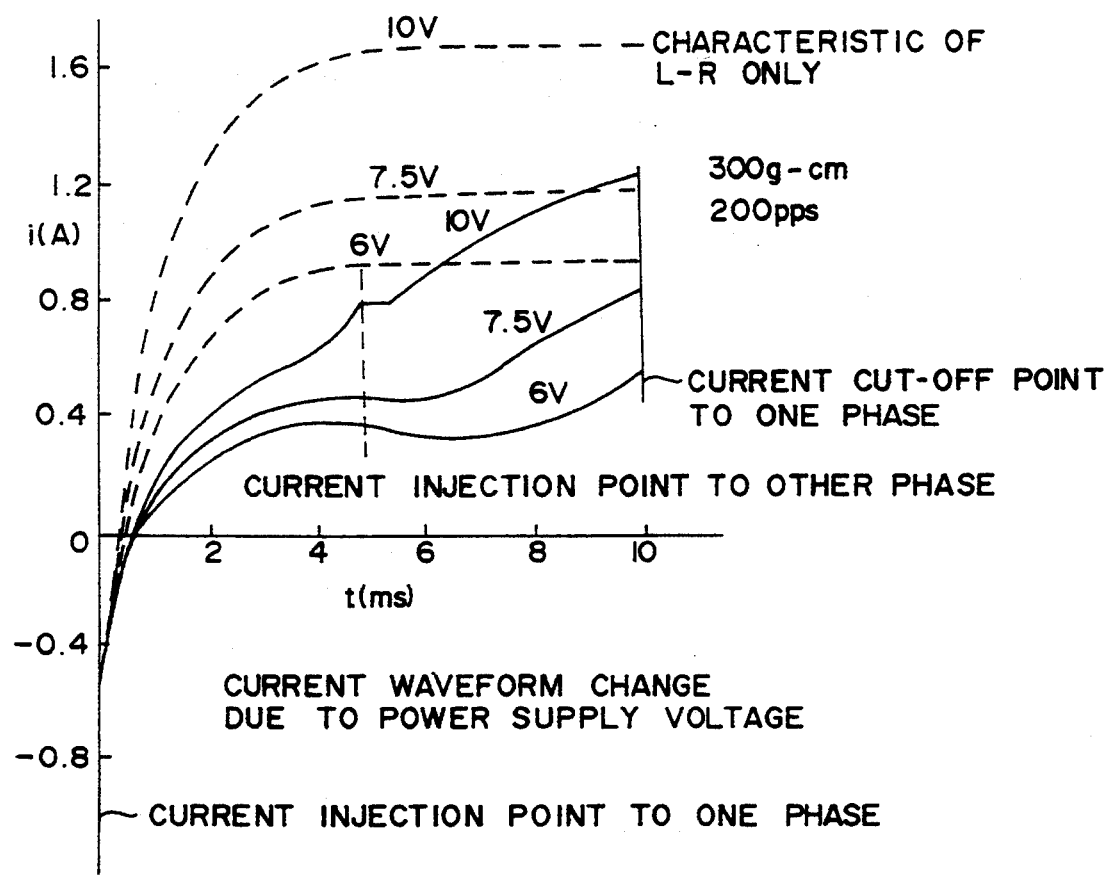
FIG. 22 is a graph to show the change in the driving current in the parameter of the driving voltage of the stepping motor.

Shown in FIG. 22 are current waveforms of a PM type stepping motor driven at a constant frequency (200 PPS) and a constant load torque (300 g·cm) but at 3 different driving voltages, i.e., 6 volt, 7.5 volt and 10 volt. Also shown in FIG. 22 by phantom lines are current waveforms when the above 3 different voltages are applied to an L–R series circuit having the same inductance and resistance as the motor.

Figure 23:
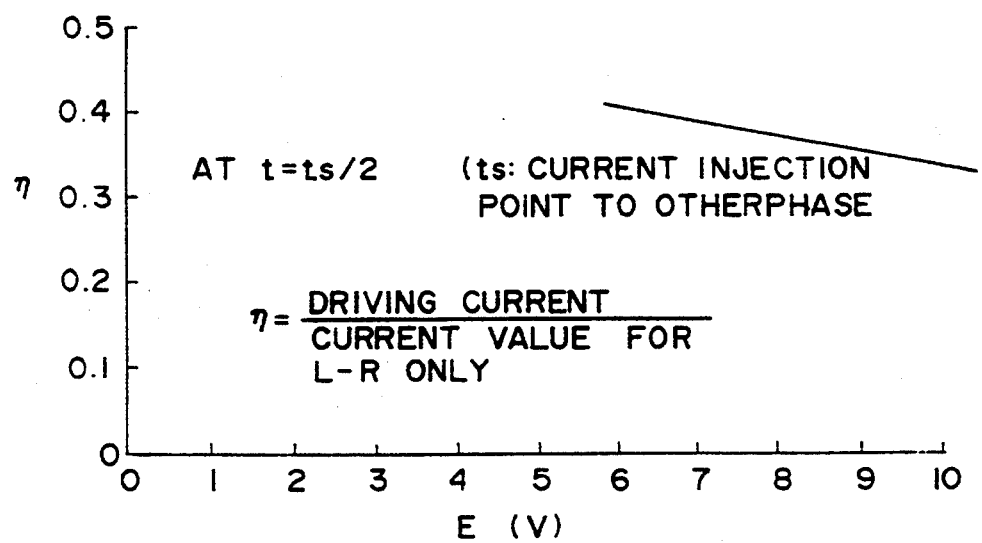
FIG. 23 is a graph, as a function of the driving voltage E the ratio of motor driving current to the current flowing through an L-R series circuit at an intermediate time from the current injection to one phase to the current injection to another phase.

Shown in FIG. 23 are graphs of the ratio $\eta$ of the driving current and the motor driving current in the L–R series circuit as a function of the driving voltage E in the time duration from the current injection in one phase to the current injection in the other phase. Since efficiency of a stepping motor is basically low, the equivalent circuit is very similar to the well known L–R series circuit at high driving voltage or low frequency. As a result, features in the driving current waveform are insignificant. On the other hand, if the driving voltage is low or the frequency is high, a significant amount of electric power supplied to the motor coil must be consumed for mechanical power, thereby distorting the current waveform from the L–R series equivalent circuit as illustrated.

This leads to the following conclusions:

The driving current flowing into the motor coil is less than the current flowing in an L–R series circuit having the same parameters as the motor coil.

The ratio of the actual motor driving current and the current in the equivalent L–R series circuit is relatively higher at a lower driving voltage in the time interval between the current injection points in one and the other phases.

After current injection in the other phase, the driving current increases rapidly if the driving voltage is high.

Figure 24:
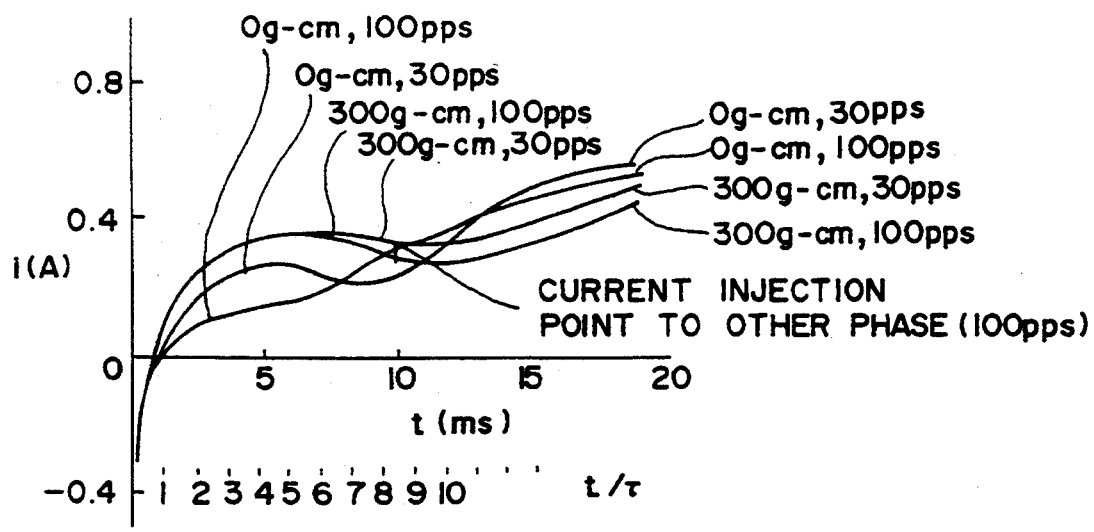
FIG. 24 is a graph to compare the current waveforms immediately after injecting current to one phase when driving the same motor by a different frequency and load torque.

FIG. 24 illustrates comparisons of current waveforms near the current injection point in its own phase when the same motor is driven at different frequencies (30 and 100 PPS) and with different load torques (0 and 300 g·cm). FIG. 24 proves the following facts:

Any change in current waveform due to change in the load torque is significant in a constant time lapse from the current injection in its own phase. In the particular motor, it is within 5 to 10 times of the time constant of the motor coil.

If the driving frequency is low, the current at the above point is relatively large even under a load condition. This is assumed to happen because the motor rotor stops completely before the subsequent pulse is applied if the frequency is low, thereby requiring an additional torque to accelerate the inertia moment of the rotor and the load.

Figure 25:
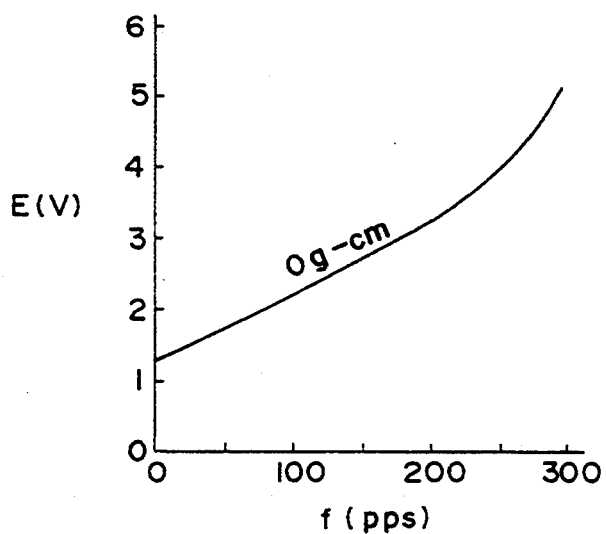
FIG. 25 is a graph showing the critical voltage to cause pull-out as a function of revolution frequency f when the motor is rotated with no load.

In summary, it is desirable to drive the motor by as low a voltage as possible in order to enhance the change (or feature) in the driving current waveform of the motor due to the load torque. It should be noted, however, that the pull-out may occur if the driving voltage is excessively low. Shown in FIG. 25 is a curve of the minimum pull-out voltage (pull-out limit voltage) of the same motor revolving without any load as a function of revolving frequency f. Obviously, the pull-out limit voltage is higher as the frequency goes higher.

Figure 26:
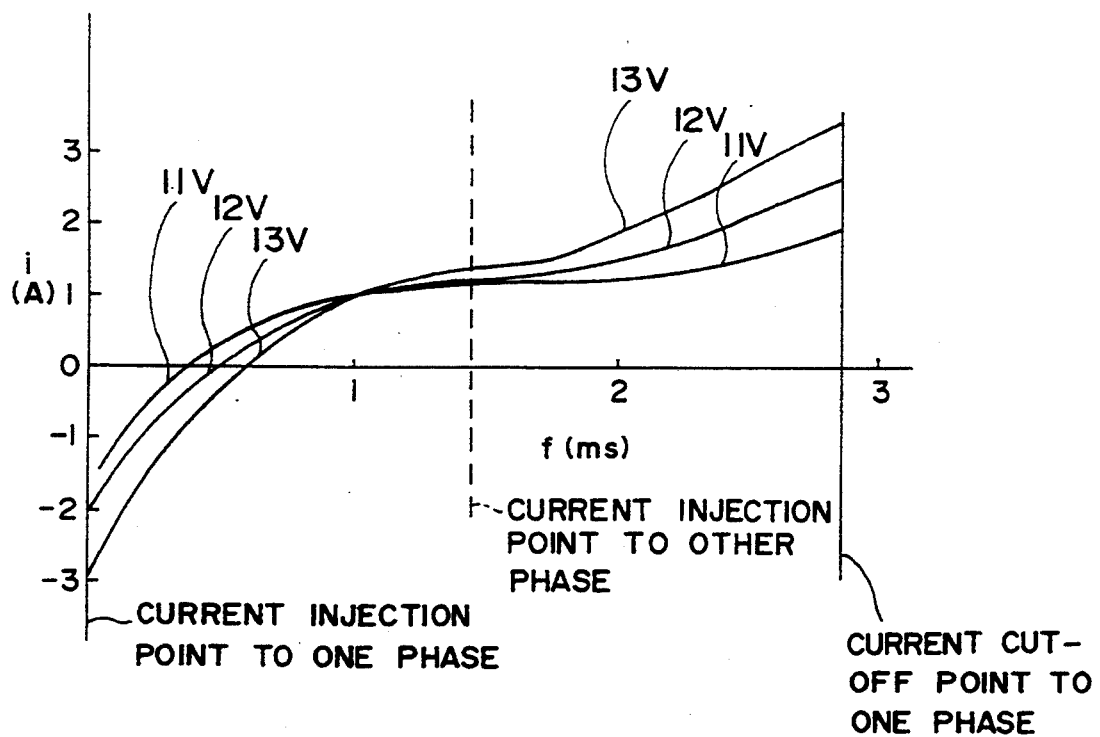
FIG. 26 is a graph to show how the driving current waveform changes as a function of the driving voltage.

FIG. 26 shows how driving current waveforms change depending on the driving voltage with an HB type motor (model PJ55-A1 from Nippon Pulse Motor Company) driven at 700 PPS and with the load torque of 3 Kg·cm.

Although there is no significant peak in the current waveform, similar trends as a PM type motor are seen.

Figure 27:
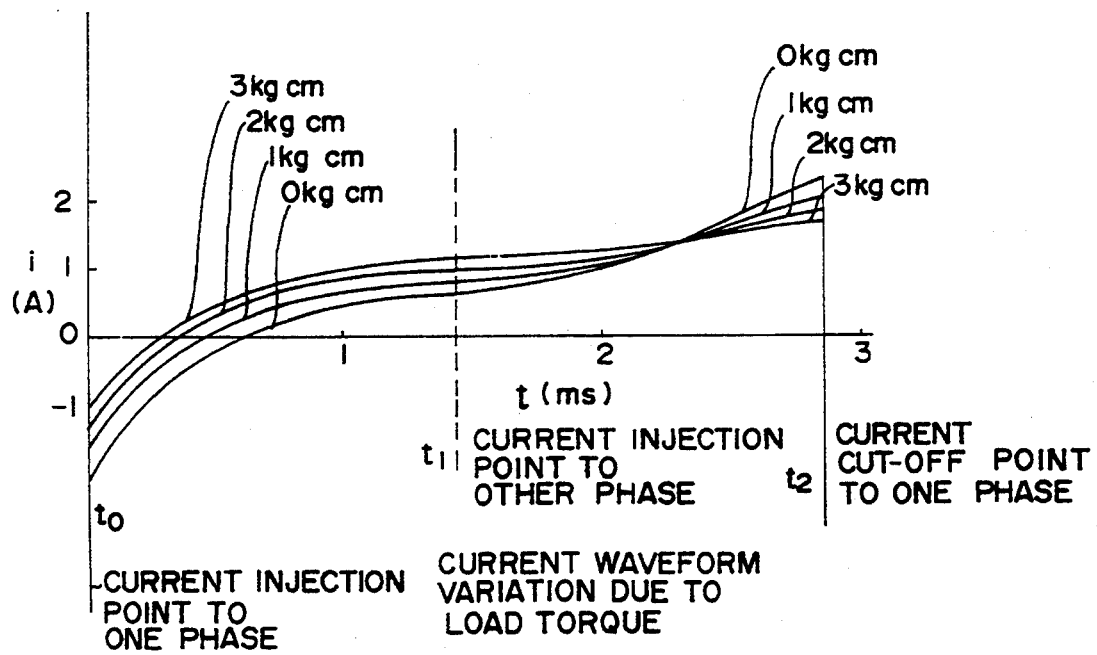
FIG. 27 is a graph to show how the driving current waveform changes as a function of load torque while maintaining the frequency and driving voltage of the motor constant.

Illustrated in FIG. 27 are driving current waveforms of the same motor driven at the same frequency and changing the load torque to 4 different values (0, 1, 2 and 3 Kg·cm) while maintaining the driving voltage constant.

Figure 28:
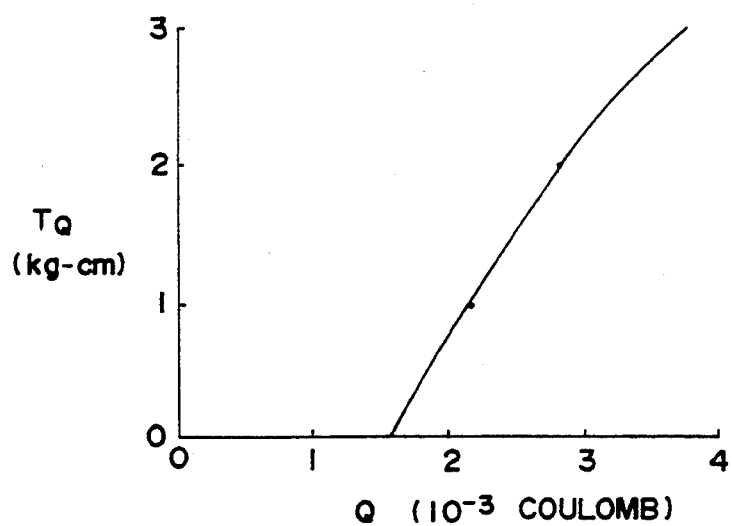
FIG. 28 is a graph to show the load torque TQ with respect to the integrated value Q of the positive driving current flowing into the motor from the current injection point to one phase to that to the other phase.

FIG. 28 shows the relationship between the load torque TQ and the integration Q of the positive driving current flowing into the motor in the time interval between the current injection points in the one and the other phases. This suggests that the load torque of an HB type motor can be obtained accurately by the feature in the driving current waveform in the manner as described hereinabove. Accordingly, for efficient load torque measurement, it is required to reduce the driving voltage depending on the measurement frequency so that features in the current waveform become more significant. If the frequency is lower than the pull-out limit voltage in FIG. 29, the driving voltage must be reduced accordingly. It is apparent that the feature in driving current for a PM type motor can be obtained in the above means.

Figure 29:
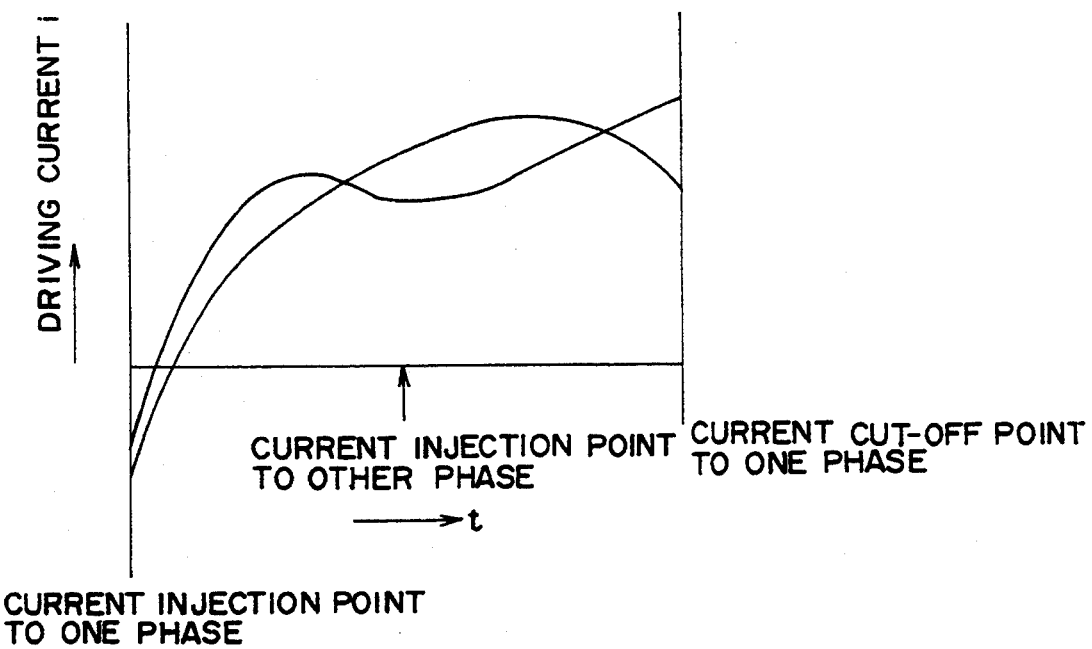
FIG. 29 is a driving current waveform when pull-out occurs in the motor.

FIG. 29 is a driving current waveform when pull-out occurred in the motor. Current waveforms in a plurality of adjacent time intervals are superimposed in FIG. 29. This shows that the current waveform fluctuates and is not stable if pull-out occurs. Pull-out condition of the motor can be detected easily from the above phenomenon.

The above facts suggest that the motor driving voltage should be set as low as possible in order not to cause pull-out of the motor at the selected load torque and frequency and to enhance the feature in the driving current waveform due to change in the load torque for a stepping motor. Practically, the pull-out limit voltage is detected of the selected torque and frequency (and temperature); then a suitable factor is multiplied to such voltage to determine the actual driving voltage.

It is also understood from the above description that the preferred feature in the driving current waveform is an integration of the driving current for a predetermined time interval within the current injection points in one and the other phases.

However, in the negative current zone immediately after the current injection represents the discharge current stored in the motor coil which is not significant for the immediate purpose. This current zone is better excluded. Particularly, in an HB type motor, the integration should be limited only to the positive interval in the driving current as discussed hereinafter.

An apparatus for measuring the temperature characteristic of a stepping motor is now described.

Figure 30:
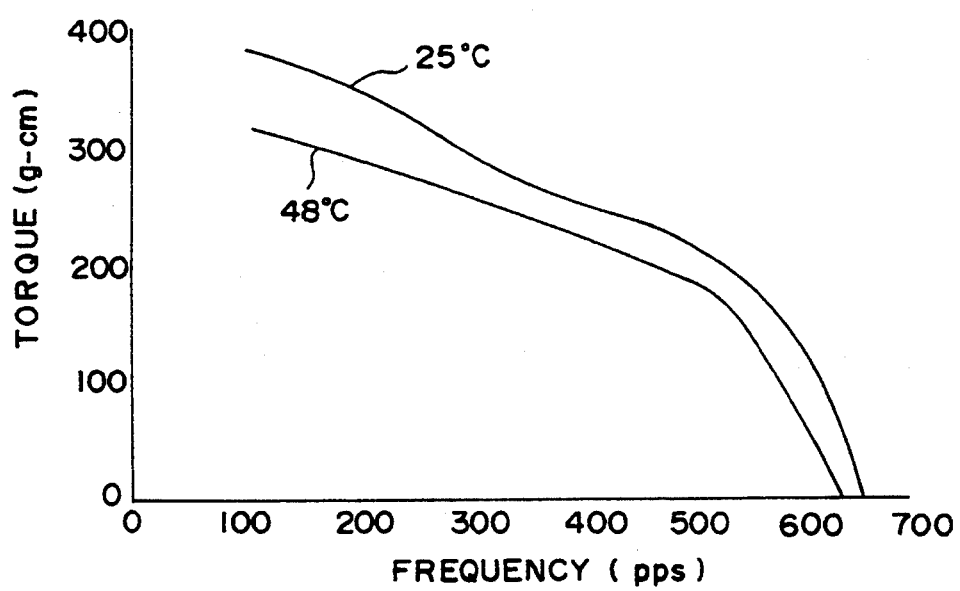
FIG. 30 is one example of the temperature characteristic of the stepping motor.

Shown in FIG. 30 is an example of the temperature characteristic of a stepping motor, model PF42-48105 manufactured by Nippon Pulse Motor Company. A well known driving frequency—output torque characteristic is measured at 25° C. and 48° C. at the outer shell of the motor. This suggests that compensation for temperature characteristic is preferable when motor temperature changes over a wide range.

In order to achieve this, features in the driving current waveform of the above motor are measured with parameters not only in regard to the above mentioned revolution frequency and the load torque but also with respect to temperature. In this case, it is necessary to calibrate the features with known torque and temperature in advance. A practical example will be described hereinbelow.

Then, the measurement apparatus for a stepping motor implemented as a microcomputer applied system is described in detail.

Figure 31:
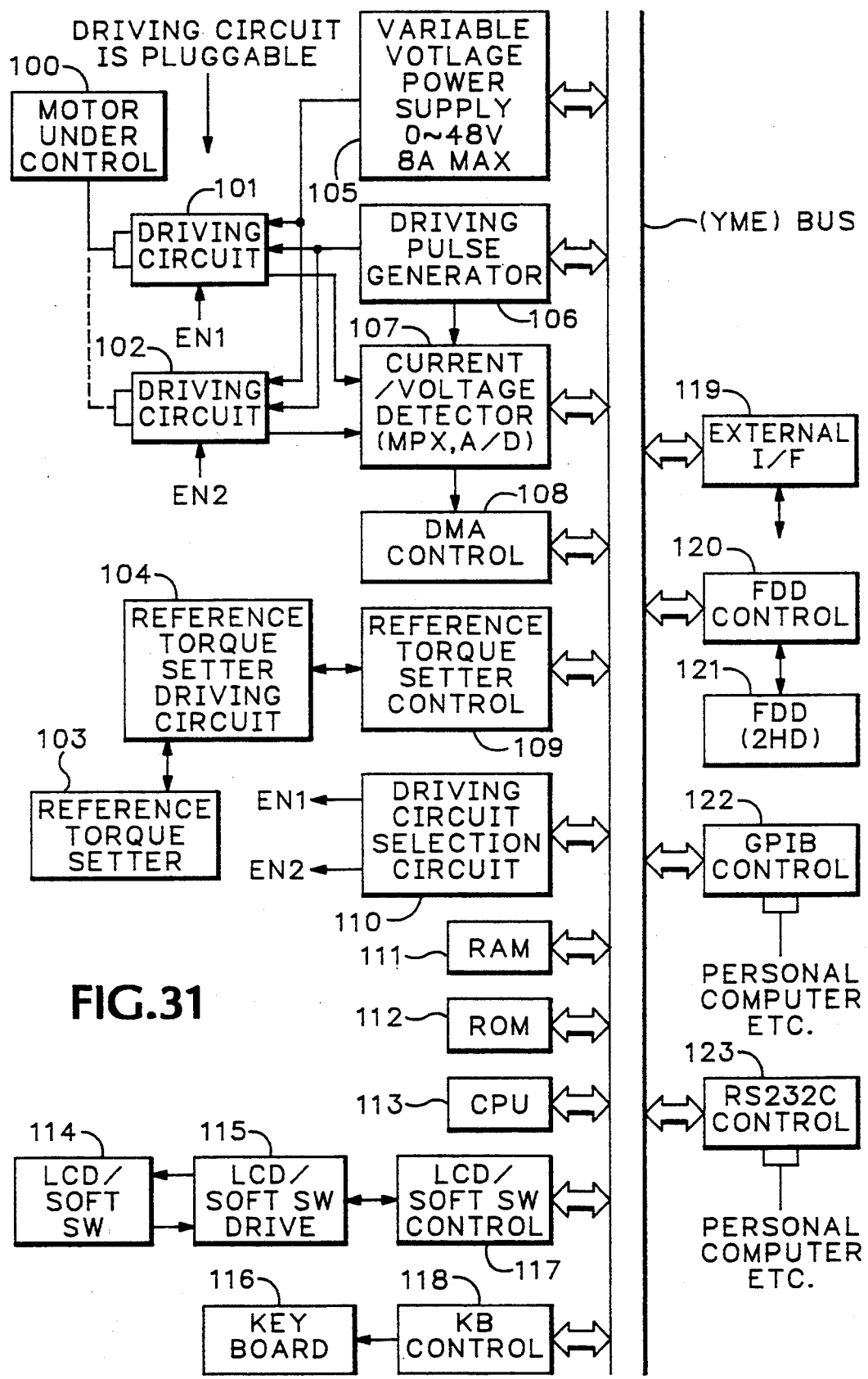
FIG. 31 is a block diagram of the system of one embodiment of the present invention.

FIG. 31 is one embodiment of such a system. Similar to a typical system, there are disposed on a bus a microcomputer (CPU) 113, a ROM 112 and a RAM 111. Also controlled by way of an interface (I/F) 117 is an LCD/software switch driver 115 to drive an LCD/software switch 114. A keyboard 116 is connected by way of an I/F 118. Such man-machine interface is used to enter the measurement conditions and display messages from the main system or measurement results. Additionally, a GP-IB interface 122 or an RS232C interface 123 enables data communications with an external computer (personal computer). Also connected to the bus are an FDD controller 120 for controlling an FDD 121 and an external interface 119.

A driving pulse generator 106 on the bus generates a driving timing pulse to a motor under test 100 in accordance with instructions from the CPU 113. Either a unipolar motor driving circuit 101 or a bipolar motor driving circuit 102 can be selectively used. The driving circuits 101, 102 are powered by a variable voltage power supply 105 with 0–48 volts and 8 A max and may be configured using transistors Q1 through Q4 as illustrated in FIGS. 1A-B. The driving circuit drives the motor under test 100 and includes current/voltage detection means 107 such as a resistor or the like in a manner similar to FIGS. 1A-B. The detected instantaneous current is digitized by an A/D converter at an appropriate sampling interval and sequentially stored in the RAM 111 under control of a DMA controller 108. The sampling may be initiated by the trigger pulse from a trigger generator also on the bus. The trigger generator receives a sync pulse from the above pulse generator in order to synchronize in timing the sampling pulse from the trigger generator and the motor driving pulse.

Prior to measurement, a reference torque setting controller 109 is driven under control of the CPU 113 to drive a reference torque setter 103 by a driver circuit 104. In this particular embodiment, the motor driving voltage must be properly set to enhance the feature in the current waveform due to change in the load torque. To this end, a properly set voltage is applied to the driving circuit from the variable voltage power supply 105 on the bus.

Now, the load torque measurement of the embodiment as illustrated in FIG. 31 will be described by reference to a flow chart. In this embodiment, the features in the load torque—current waveform of a motor under test are first calibrated and then the motor is coupled to the actual load mechanics before measurement of the load torque.

Figure 32:
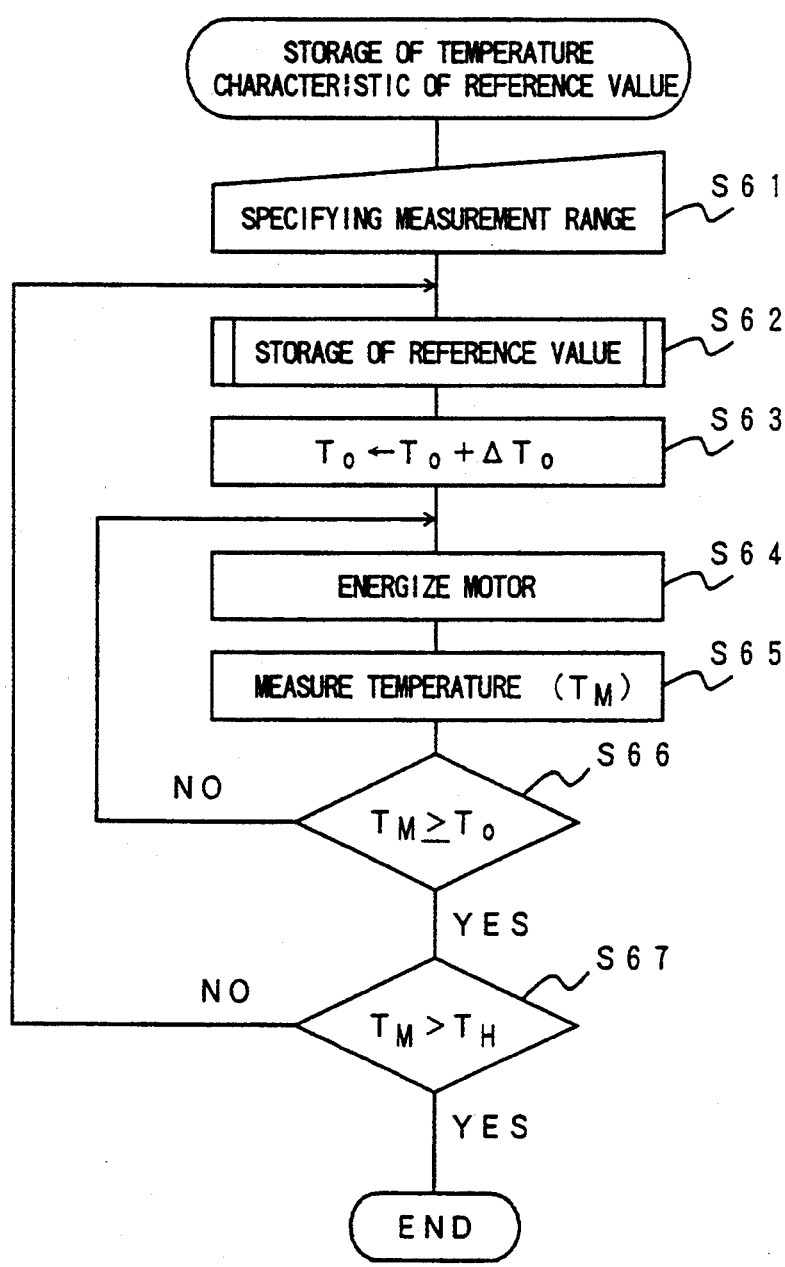
FIG. 32 is a flow chart to show processing steps to measure the relationship (reference value) between the load torque and the characteristic in the current waveform when a known load torque is applied to the motor to be measured.

Illustrated in FIGS. 32 through 36 are flow charts of the steps to apply known load torques to the motor under test and obtain the relationship between the load torque and the features in the current waveform (reference value). As shown in FIG. 32, a first step is to enter the measurement conditions. In this step, designated are the maximum and minimum measurement frequencies fH and fL, the maximum temperature TH, an optimum driving voltage EH to be applied to the driving circuit, the maximum and minimum load torques TQH and TQL to be measured, and their increments $\Delta f$, $\Delta T0$, $\Delta E$ and $\Delta TQ$ during measurement.

Figure 33:
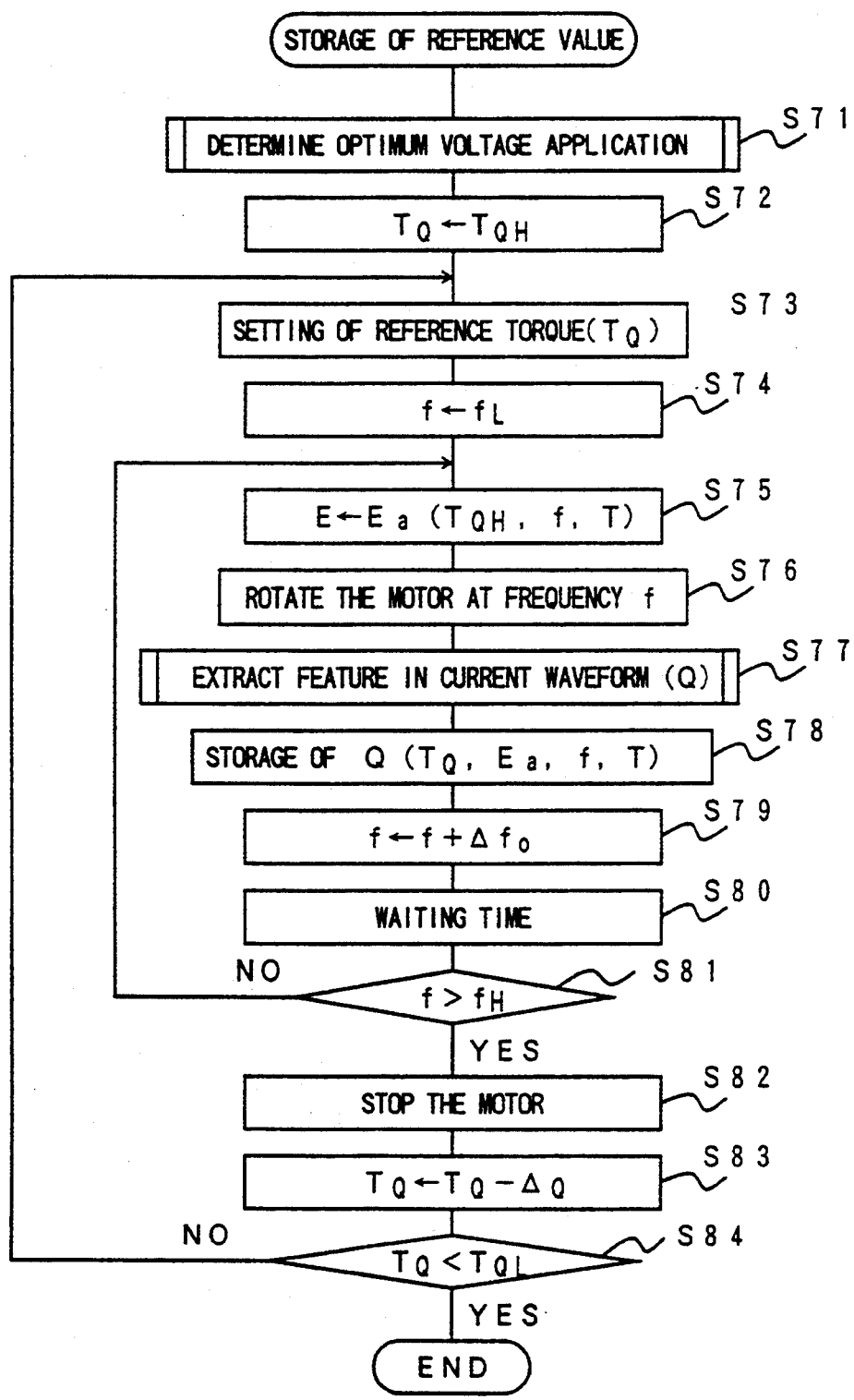
FIG. 33 is a flow chart to show processing steps for storing the reference value in FIG. 32.
Figure 34:
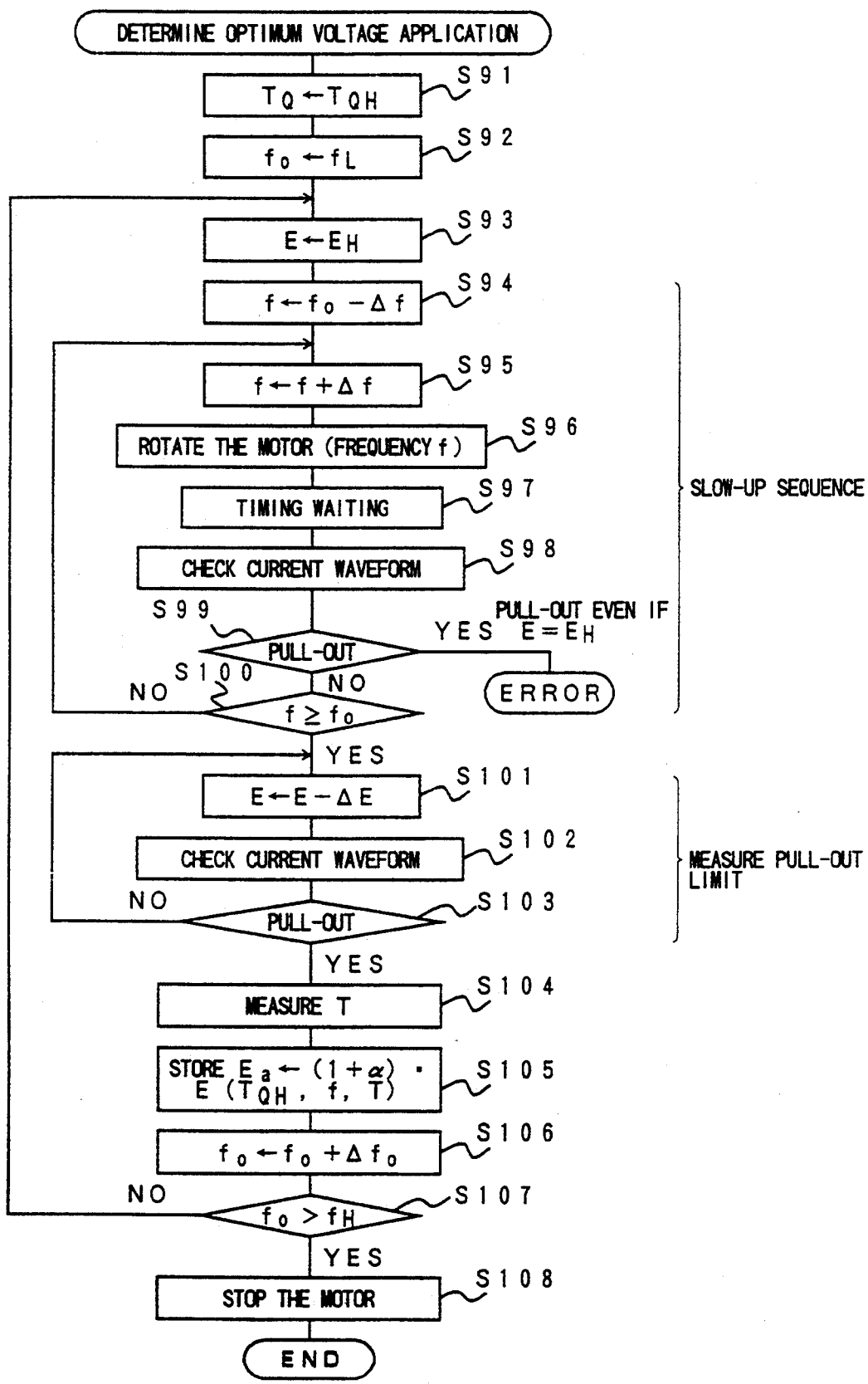
FIG. 34 is a flow chart to show processing steps to determine the optimum applied voltage in FIG. 32.

The apparatus of this embodiment receives the above measurement conditions and initializes the frequency to the minimum value fL, the load torque to the maximum value TQH, the power supply voltage to the maximum level EH, and designates the measurement range (step S61) before performing the reference value measurement. After completion of the setting, the reference value is stored (step S62). Storage of the reference value is carried out in the steps as illustrated in FIG. 33. A first step is to determine the optimum driving voltage (step S71). This is performed as illustrated in FIG. 34. The load torque TQ to be applied to the motor is first set to the maximum value TQH so that pull-out does not occur in the necessary measurement range (step S91). Then the target value f0 of the measurement frequency is set to the minimum frequency fL (step S92). The following processings are performed to determine the optimum driving voltage at each frequency.

Firstly, the driving voltage E is set to the highest value EH (step S93). The motor speed is gradually increased to the target frequency in the slow-start method (steps S94 through S96). A waiting period is provided in the process of increasing the revolution speed to check the driving current waveform (steps S97 and S98). It is confirmed that no pull-out of the motor occurs (step S99). If pull-out occurs even at the highest driving voltage EH, there must be an error and the motor is stopped.

On confirming that the predetermined frequency f0 has been reached in step S100, the driving voltage is gradually decreased while monitoring the driving current waveform to determine the pull-out limit voltage (step S101). The current waveform is examined (step S102) to determine the pull-out limit voltage (step S103). If pull-out is detected, the driving voltage at that time is the pull-out limit voltage.

A next step is to measure the motor temperature T at the outer surface of the motor or by means of the well known resistance method for measuring the resistance of the motor coil (step S104). A suitable factor $\alpha$ is used and the optimum driving voltage is obtained by multiplying the detected pull-out limit voltage and the factor $(1+\alpha)$. The optimum driving voltage is stored in a file or a memory along with the other parameters TQH, f and T when the measurement was made (step S105). Subsequently, the target frequency is incremented by $\Delta f0$ (step S106) and the above steps are repeated. In step S107, measurements are completed at all frequencies within the intended frequency range and the motor is stopped when f0 exceeds fH. Now, the optimum driving voltage determination procedure is finished.

After finishing the optimum driving voltage determination procedure, return to FIG. 33 again and continue to store the reference value with different load torque applied to the motor.

The load torque is first set to the maximum value TQH (step S72). Subsequently, a reference torque TQ is applied (step S73). Application of a known load torque is made using a PARMA TORQUE or the like from Cosin Racin Company. This is accomplished by utilizing a hysteresis magnetic material and setting a dial to a predetermined scale for applying a known torque to the revolution shaft. The dial setting can be made manually or automatically using a stepping motor or the like. After setting the torque to a desired level, the frequency f is set to the minimum value fL of the measurement range (step S74) before measuring the features in the current waveform. The features Q in the current waveform are extracted while driving the motor at the frequency f and under the optimum driving voltage Ea for the selected parameters TQH, f and T (steps S75 through S77). The obtained features Q are stored with TQ, Ea, f and T as the associated parameters (step S78). Subsequently, the frequency is incremented by Δf0 (step S79) and a delay of Δt is provided (step S80). The above measurements are repeated with the same torque until the frequency is confirmed to have reached the maximum level fH. Gradually increasing the frequency from the low frequency to the high frequency, the motor executes the slow-up operation.

After finishing the measurements over the intended frequency range at a given torque, the motor is stopped for some time if necessary (step S81) and the torque is changed. That is, the torque TQ is reduced by ΔTQ (step S82) before repeating the above measurement steps. If completion of measurements on the entire torque range is determined in step S82, storage of the reference values is finished.

Returning now to FIG. 32, temperature characteristic measurement and storage are performed, if necessary. That is, the measurement temperature is incremented by ΔT0 from the target value T0 (step S63). A current is supplied to the motor coil to heat the motor to an intended temperature while maintaining the motor stationary (step S64). The current is continued while measuring the temperature TM (step S65). When the motor temperature reaches or exceeds the new target T0, the reference values associated therewith are continued to be stored (step S67) until measurements at the maximum temperature TH are completed.

Extraction of features in the current waveform is described by way of an example. In this description, understanding is aided if reference is made to the measurements of the motor coil current in FIGS. 27 and 28.

In this example, measurements are performed on an HB type stepping motor PJ55-A1 from Nippon Pulse Motor Company at a frequency of 700 PPS and with load torque of 0, 1, 2 and 3 Kg·cm. In FIG. 27, measurements are made over the time interval from the current injection point in its own phase t0 to the current cut-off point to the phase t2 by way of the current injection point in the other phase t1.

In this embodiment, the features in the current waveform are defined by the integration of the driving current for the time interval where the driving current is positive in the time interval t0–t1. However, as mentioned above, if the driving frequency is low, the integration time should be limited from t0 to a predetermined time.

Illustrated in FIG. 28 is a plot of the above integrated values (features in the current waveform) for the horizontal axis and the load torque TQ for the vertical axis. In this manner, obtained are the features in the current waveform vs. load torque characteristic for an HB type stepping motor. It is of course true that the features in the current waveform for a PM type motor can be obtained in a similar manner.

Figure 35:
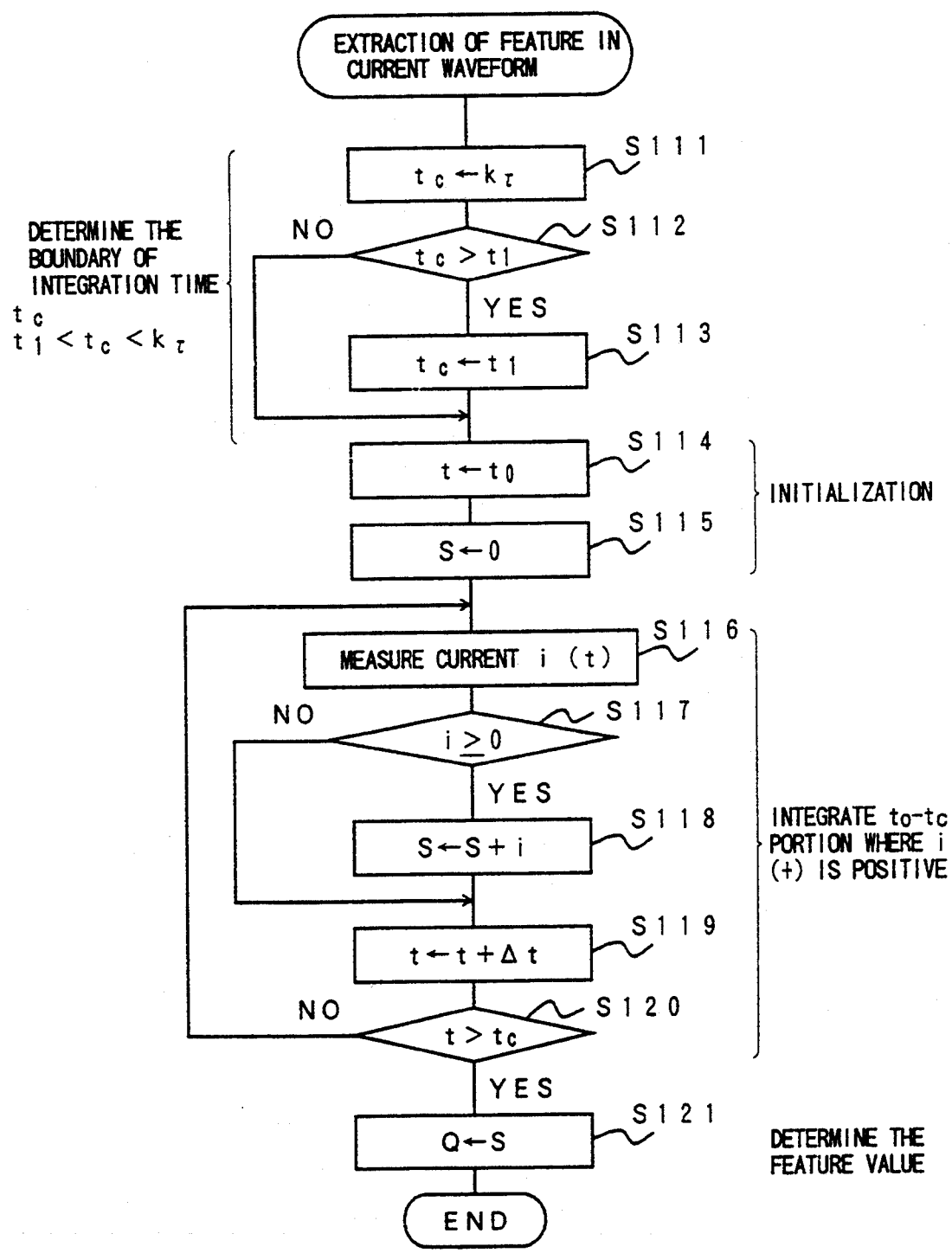
FIG. 35 is a flow chart to show processing steps to obtain characteristics in current waveform of the reference value in FIG. 32.

FIG. 35 is a flow chart for extracting the features in the current waveform. The above integration is carried out over the time interval τ between to and the limit of integration tc. In order to determine tc, the product of the time constant Z in the electrical system of the motor and a desired coefficient K is determined (step S111). If tc exceeds the current injection point in the other phase t1, it is limited to t1 (steps S112 and S113).

A next step is to initialize the time t to t0 before integrating the driving current (step S114). Also initialized is the integrated value S (step S115) before measuring the driving current i(t) (step S116). If the integration time is determined to have reached the time t, a judgment is made whether i(t) is positive or not (step S117).

In step S117, the integrated value is added to the integration S (step S118) but no integration is performed if i(t) is negative. On completing the integration at time t, the time for the next integration is determined by incrementing Δt to t (step S119).

In step S120, the integration is stopped when the integration time is determined to have reached the limit tc.

The integrated value S in the above steps is defined as the feature in the current waveform Q to be obtained (step S121). If the reference measurements on the motor under test are over a desired range, the measured features Q are put in order for convenience in the subsequent load torque measurements.

Figure 36:
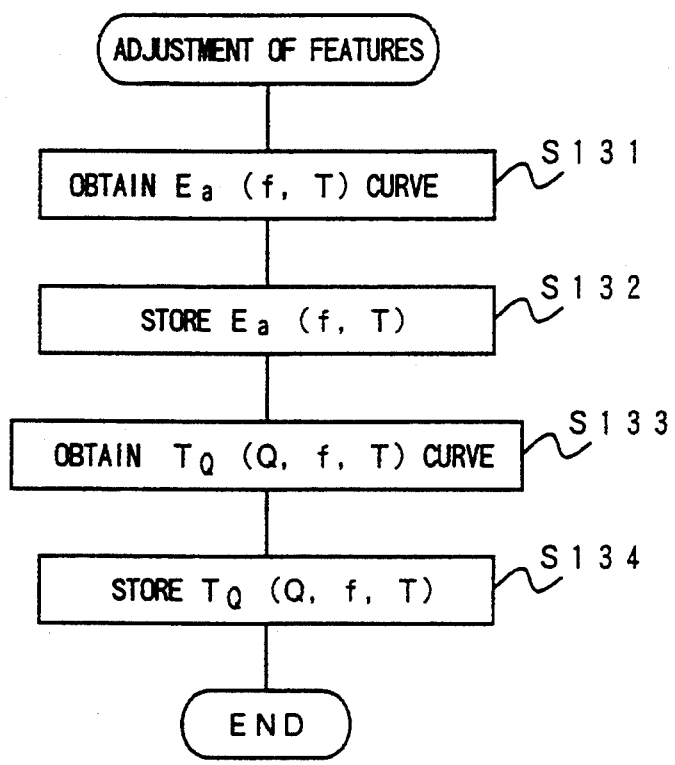
FIG. 36 is a flow chart of processing steps for adjustment of a feature value.

FIG. 36 is a flow chart of steps to place the features in order.

The optimum driving voltage Ea is measured as a function of frequency and temperature (step S131) and stored (step S132). In subsequent measurements, the necessary value will be available very easily. For example, the optimum driving voltage Ea at a certain temperature T can be expressed in a graph as a function of frequency f by using any known interpolation technique to obtain the coefficient. Then, the coefficient may be similarly interpolated with respect to temperature T to obtain its coefficient to express Ea as a function of T and f. The results are placed in order as the coefficients of these functions.

Next steps include measuring the load torque, placing the same in order and storing as a function of the features in the current waveform (steps S133 and S134). At this time, it is convenient if the features in the current waveform depend on frequency and temperature. The above steps complete the preparation for the load torque measurement. Subsequent measurements can be made by assembling the motor under test to the actual machine or mechanical part.

The advantages of the present invention are significant in quantity production machines utilizing the same type of motors. The reason is that if the load torque-features in the current waveform relationship are once calibrated, the load torque can be measured easily within the tolerance in manufacturing of such motors. As a result, the present invention finds wide and useful industrial applications in such areas as quantitative approaches to development, quality control and problems in pilot quantity production as well as quantitative discussions on inspection, development and manufacturing on the production line.

Figure 37:
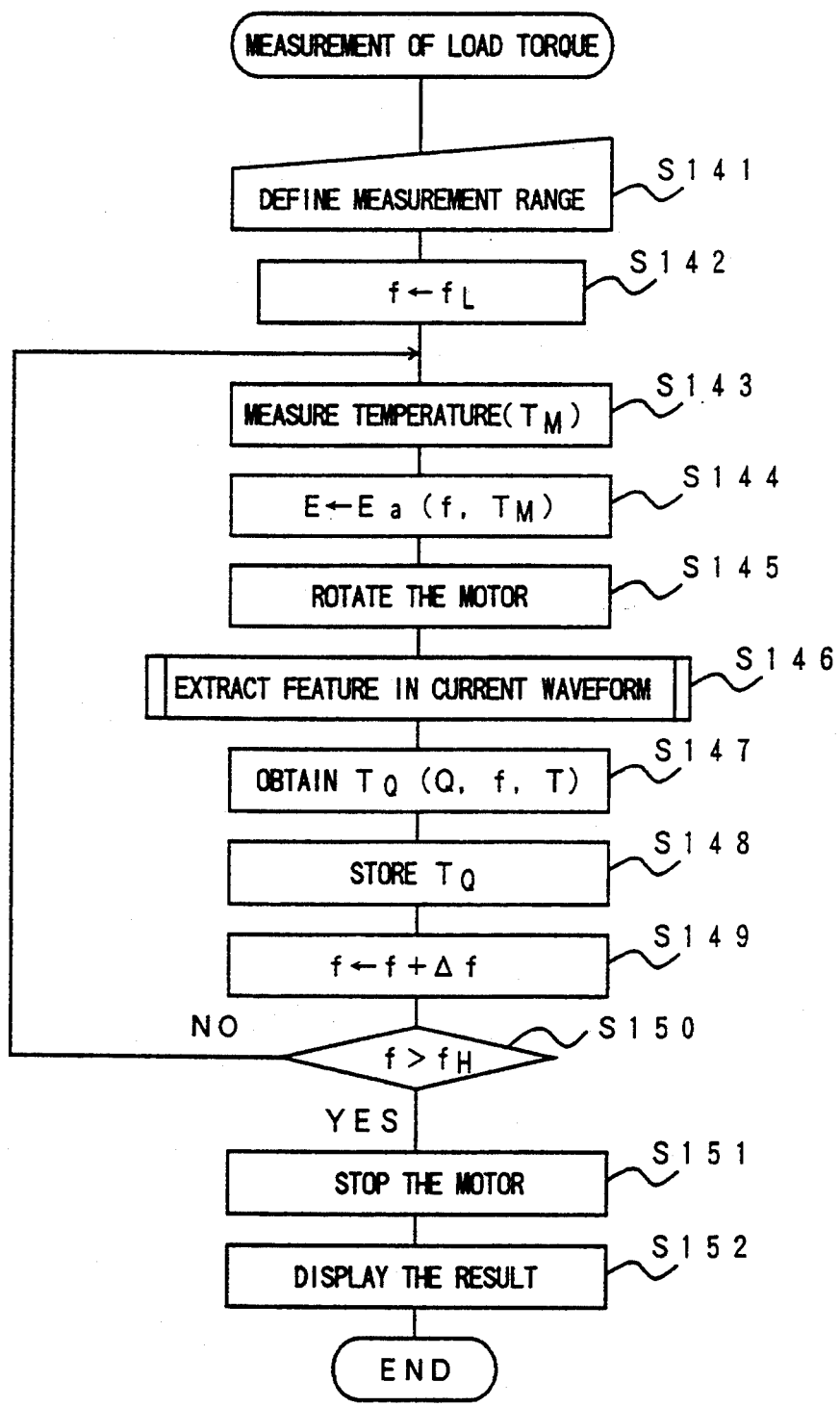
FIG. 37 is a flow chart of the steps of measuring the load torque.

Illustrated in FIG. 37 are the steps of measuring the load torque.

Initially designated are the maximum and minimum frequencies fH, fL and increment Δf (step S141). After initializing the frequency to fL (step S142), the temperature is measured (step S143). The optimum driving voltage is determined and is applied to the motor (step S144). Then, the motor is controlled to revolve at frequency f (step S145), whereupon the features in the current waveform are extracted (step S146). The load torque is measured (step S147) and is stored (step S148). Following is incrementation of the frequency by Δf (step S149) and measurement of the load torque is repeated according to the above steps.

The above operations are repeated until f is confirmed to be larger than fH in step S150, thereby measuring the frequency characteristic of the load torque in the above measurement range while the motor is assembled to an actual load.

After completing the above measurements, the motor is stopped (step S151) and the measurement results are displayed in a graph, a chart or the like (step S152).

Described hereunder is an apparatus incorporating the load torque measurement apparatus for a stepping motor according to the present invention.

Figure 38:
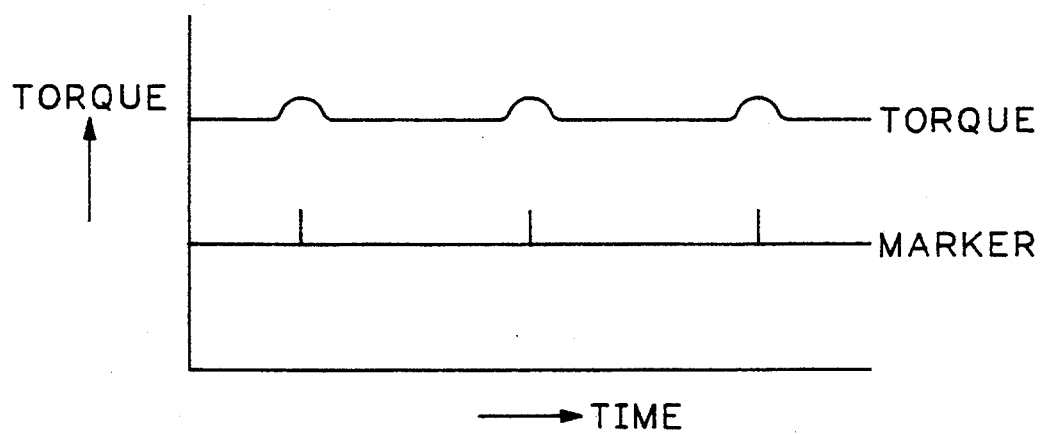
FIG. 38 is a graph to show fluctuation in the load torque.

FIG. 38 shows waveforms to measure the load torque fluctuation as the motor revolves due to backlash or looseness in the mechanical part assembled to the motor. Generally, the mechanical power derived from the output shaft of the motor is transferred to various parts of the mechanism by way of a large number of pinion/gears. Accordingly, fluctuation in the load torque does not necessarily coincide in its period with the revolution of the motor. Therefore, a marker pulse dividing the driving pulse is supplied to the motor. By proper adjustment of the dividing ratio, the fluctuation period in the load torque and the repetition period of the marker are made to be identical. This is advantageous in analyzing the cause of troubles by taking gear mechanism and the like in the mechanical part or the machine into consideration.

Figure 39:
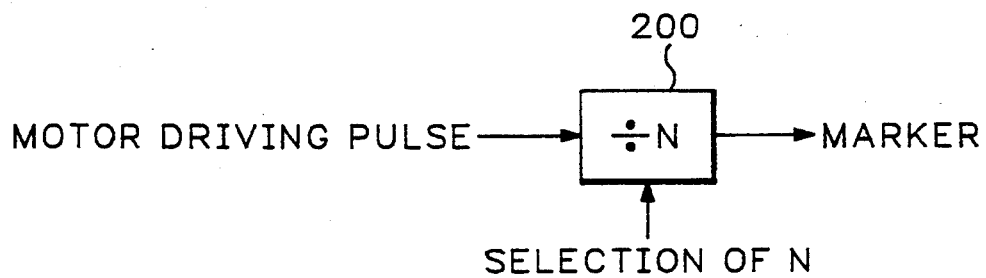
FIG. 39 illustrates an embodiment of a marker generator.

FIG. 39 is an example of generating the above marker. Proper choice of the dividing ratio N of a frequency divider 200 receiving the driving pulse to the motor will generate the marker as illustrated in FIG. 38.

Figure 40:
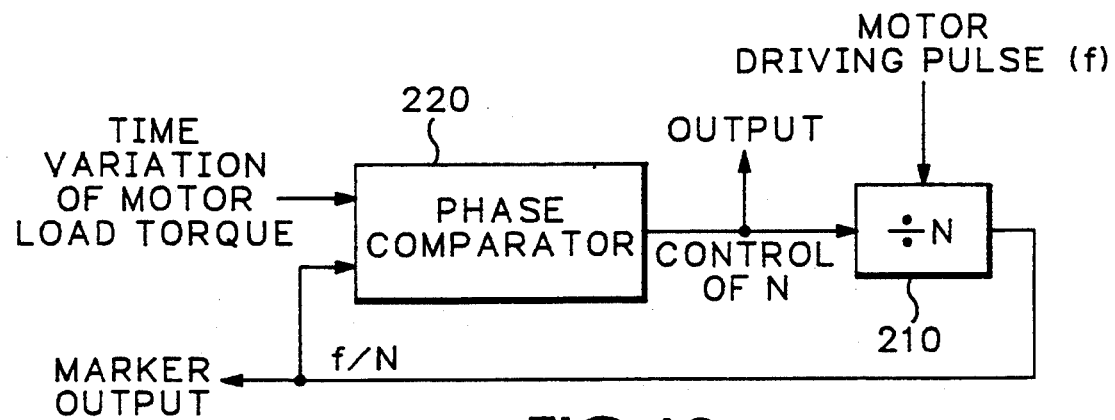
FIG. 40 is a block diagram to show another embodiment of the marker generator.

Another example of the marker generator is shown in FIG. 40, wherein the so-called PLL (phase locked loop) technique is used. A phase comparator 220 is employed to compare the divided output (f/N) from a frequency divider 210 to divide the motor driving pulse by the factor of N and the quantity proportional to the fluctuating load torque. If the fluctuation in the load torque leads the marker frequency in phase, the dividing ratio of the divider 210 is decreased. On the other hand, if it lags in phase, the dividing ratio is increased. As a result, the output from the phase comparator 220 controls the dividing ratio N automatically. The output marker is derived from the divider 210.

As understood from the above description, if the load torque measurement apparatus is used for a stepping motor according to the present invention, the output torque from an assembled stepping motor can be measured accurately. Accordingly, characteristics of the load mechanism of a motor, the coupling condition between the load mechanism and the motor and the like can be understood objectively in every development phase of the stepping motor applied machine, from the initial development stage to a quantity production stage.

What is claimed is:

1. A load torque measurement apparatus for a stepping motor comprising:

memory means for storing relational data of a torque as applied to said stepping motor and of a predetermined feature from the dynamics of a driving current or voltage of said stepping motor when the torque is applied;

detection means for detecting a driving current or voltage when an actual load is applied to said stepping motor;

feature extraction means for extracting information of a feature from the dynamics of said driving current or voltage as detected by said detection means; and reference and determination means for comparing the information of said feature as extracted by said feature extraction means with the relational data stored in said memory means and outputting information representative of the loading provided by the actual load.

2. A load torque measurement apparatus for a stepping motor according to claim 1 wherein the relational data stored in said memory means is feature information in driving current generated by interpolating between data of separate respective features when a plurality of known torques are applied.

3. A load torque measurement apparatus for a stepping motor according to claim 1 wherein the feature information is a peak value in a time interval proximate the start up of the driving current.

4. A load torque measurement apparatus for a stepping motor according to claim 1 wherein said feature extraction means comprises a neuro circuit network including an input layer for receiving sample values of driving current, an intermediate layer for receiving outputs from said input layer and an output layer coupled to outputs from said intermediate layer, wherein a plurality of sample valises of the driving current, when known torques are applied to the motor under test, are applied to said input layer in a learning stage so that outputs from said output layer may be compared with known torques as a teaching signal.

5. A load torque measurement apparatus for a stepping motor according to claim 1 wherein the stepping motor is driven by a constant voltage for exciting unipolar or bipolar driving circuits.

6. A load torque measurement apparatus for a stepping motor comprising:

memory means for storing relational data of torque applied to a stepping motor and information of a predetermined feature from the dynamics of a driving current of the stepping motor when the torque is applied;

detection means for detecting a driving current when an actual load is applied to the stepping motor;

feature extraction means for extracting feature information from the dynamics of the driving current detected by said detection means;

reference and judgment means for determining and outputting information representative of the actual load from the feature information extracted by the feature extraction means with reference to the relational data stored in said memory means; and driving means for driving the stepping motor in a calibration procedure under a voltage where no pull-out occurs in the stepping motor and in an actual load measurement under the same voltage.

7. A load torque measurement apparatus for a stepping motor comprising:

memory means for storing relational data of a torque applied to a stepping motor and feature information defined by an integration of a driving current of a given phase of the stepping motor to which the torque is applied over a time interval between the start of current injection of the given phase of the stepper motor and the start of current injection of the next phase;

detection means for detecting an integration value of the integrated driving current in the stepping motor with an actual load applied thereto for a time interval between the start of current injection in any one phase and the start of current injection of respective next phases;

feature extraction means for extracting feature information from the dynamics of the integrated driving current as detected by said detection means; and reference and judgment means for determining and outputting information representative of the actual load by referencing the feature information extracted from said feature extraction means and the relational data stored in said memory means.

8. A load torque measurement apparatus for a stepping motor according to claim 7 wherein the integration is performed over a predetermined time interval starting at the current injection in one phase.

9. A load torque measurement apparatus for a stepping motor according to claim 7 wherein the integration of the driving current is performed over a predetermined polarity only within the phase.

10. A load torque measurement apparatus for a stepping motor comprising:

memory means for storing relational data regarding information of predetermined features from the dynamics of respective driving currents flowing in the stepping motor operating under a plurality of associated different torques and speeds in numbers of revolutions per second;

detection means for detecting a driving current when an actual load is applied to the stepping motor;

feature extraction means for extracting information on a feature from the dynamics of the driving current as detected by said detection mean; and reference and judgment means for determining and outputting information representative of an actual load by referencing the feature information extracted by said feature extraction means and the relational data stored in said memory means.

11. A load torque measurement apparatus for a stepping motor comprising:

memory means for storing relational data of information of a predetermined feature from the dynamics of respective driving currents flowing in the stepping motor at a plurality of different temperatures as operated under a plurality of associated different torques and numbers of revolutions per second;

detection means for detecting a driving current and a temperature of the stepping motor when an actual load is applied to the stepping motor;

feature extraction means for extracting information of a feature from the dynamics of the driving current detected by said detection means; and reference and judgment means for determining and outputting information of the actual load by referencing the feature information extracted by said feature extraction means and the temperature detected by said detection means, and the relational data and temperature stored in said memory means.

12. A load torque measurement apparatus for a stepping motor comprising:

memory means for storing relational data of a torque applied to the stepping motor and information of a predetermined feature from the dynamics of a driving current flowing in the stepping motor when torque is applied;

detection means for detecting a driving current of the stepping motor to which an actual load is applied;

feature extraction circuit for extracting information regarding a feature from the dynamics of the driving current detected by said detection means;

reference and judgment means for determining and outputting information representative of the actual load by referencing the feature information extracted by said feature extraction means and the relational data stored in said memory means; and means for measuring a change in the feature information extracted by said feature extraction means as a function of time.

13. A load torque measurement apparatus for a stepping motor comprising:

memory means for storing relational data of a torque to be applied to the stepping motor and information of a predetermined feature from the dynamics of a driving current flowing in the stepping motor to which the torque is applied;

detection means for detecting a driving current in the stepping motor when an actual load is applied;

feature extraction means for extracting a feature from the dynamics of the driving current detected by said detection means;

reference and judgment means for determining and outputting information representative of the actual load by referencing the feature information obtained by said detection means to the relational data stored in said memory means; and means for measuring a transmission delay characteristic of the actual load by comparing times when the driving pulse is applied to the stepping motor and when a change in the actual load is detected by said reference and judgment means.

14. A load torque measurement apparatus for a stepping motor comprising:

memory means for storing relational data of a torque to be applied to the stepping motor and information of a predetermined feature from the dynamics of a driving current flowing in the stepping motor to which the torque is applied;

detection means for detecting a driving current when an actual load is applied to the stepping motor;

feature extraction means for extracting information of a feature from the dynamics of the driving current detected by said detection means;

reference and judgment means for determining and outputting information representative of the actual load by referencing the feature information extracted by said feature extraction means and the relational data stored in said memory means; and means for comparing the load torque of the stepping motor and driving pulses of a driving current to be applied to the stepping motor divided by any desired number in order to ascertain changes thereof as a function of time.

15. An inertia moment measurement apparatus for a stepping motor comprising:

memory means for storing relational data of a torque to be applied to the stepping motor and information regarding a predetermined feature from the dynamics of a driving current flowing in the stepping motor to which the torque is applied;

detection means for detecting a driving current when an actual load is applied to the stepping motor;

feature extraction means for extracting information regarding said feature from the dynamics of the driving current detected by said detection means;

reference and judgment means for determining and outputting information representative of the actual load by referencing the feature information extracted by said feature extraction means and the relational data stored in the memory means; and means for determining and outputting information representative of the inertia moment of said actual loading by comparing the load torque derived from said reference and judgment means when the stepping motor is revolving at a constant speed and a load torque when the revolution speed is changed in time.

16. An output measurement apparatus for a stepping motor comprising:

memory means for storing the relational data of torque applied to the stepping motor and information regarding a predetermined feature from the dynamics of a driving current flowing in the stepping motor to which the torque is applied;

detection means for detecting a driving current when an actual load is applied to the stepping motor;

feature extraction means for extracting information of a feature from the dynamics of the driving current detected by said detection means;

reference and judgment means for determining and outputting a value representative of the actual load by referencing the feature information extracted by said feature extraction means and the relational data stored in said memory means; and means for calculating a product of the determined load torque of the stepping motor and an associated number of revolutions per unit time.

17. A backlash measurement apparatus for a stepping motor comprising:

memory means for storing relational data of a torque to be applied to the stepping motor and information of a predetermined feature from the dynamics of a driving current flowing in the stepping motor to which the torque is applied;

detection means for detecting a driving current when an actual load is applied to the stepping motor;

feature extraction means for extracting information of a feature from the dynamics of the driving current detected by said detection means;

reference and judgment means for determining and outputting information representing the torque of the actual load by referencing the feature information extracted by said feature extraction means and the relational delta stored in said memory means; and means for measuring backlash by measuring a change in absolute value of the so determined torque of the actual load with respect to the number of pulses of the driving current applied to the stepping motor when the stepping motor is controlled to reverse its direction of revolution. is controlled to reverse its direction of revolution.

* * * * *